(12) United States Patent
Duqi et al.

(10) Patent No.: US 10,676,347 B2
(45) Date of Patent: Jun. 9, 2020

(54) MICRO-ELECTRO-MECHANICAL DEVICE HAVING TWO BURIED CAVITIES AND MANUFACTURING PROCESS THEREOF

(71) Applicant: STMICROELECTRONICS S.R.L., Agrate Brianza (IT)

(72) Inventors: Enri Duqi, Milan (IT); Lorenzo Baldo, Bareggio (IT); Marco Del Sarto, Monza (IT); Mikel Azpeitia Urquia, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/866,380

(22) Filed: Jan. 9, 2018

(65) Prior Publication Data

US 2019/0210868 A1 Jul. 11, 2019

(51) Int. Cl.
*B81C 1/00* (2006.01)
*B81B 3/00* (2006.01)
*B81B 7/00* (2006.01)

(52) U.S. Cl.
CPC ........ *B81C 1/00198* (2013.01); *B81B 3/0021* (2013.01); *B81B 3/0051* (2013.01); *B81B 7/0016* (2013.01); *B81C 1/00158* (2013.01); *B81C 1/00182* (2013.01); *B81C 1/00246* (2013.01); *B81C 2201/019* (2013.01);
(Continued)

(58) Field of Classification Search
CPC ............ B81C 1/00198; B81C 1/00158; B81C 1/00246; B81B 7/0016; B81B 3/0021; H04R 2201/003; H01L 2224/48479
See application file for complete search history.

(56) References Cited

U.S. PATENT DOCUMENTS

| 7,344,907 B2 | 3/2008 | Colgan et al. |
| 7,767,484 B2 | 8/2010 | Ayazi |
| 7,928,960 B2 | 4/2011 | Baldo et al. |

(Continued)

FOREIGN PATENT DOCUMENTS

| CN | 104249990 A | 12/2014 |
| EP | 2 096 448 A2 | 9/2009 |
| EP | 2789578 A2 | 10/2014 |

OTHER PUBLICATIONS

Fischer et al., "Integrating MEMS and ICs," *Microsystems & Nanoengineering*, May 28, 2015, 16 pages.

*Primary Examiner* — Patricia D Reddington
(74) *Attorney, Agent, or Firm* — Seed Intellectual Property Law Group LLP

(57) ABSTRACT

A micro-electro-mechanical device, comprising a monolithic body of semiconductor material accommodating a first buried cavity; a sensitive region facing the first buried cavity; a second cavity facing the first buried cavity; a decoupling trench extending from the monolithic body and separating the sensitive region from a peripheral portion of the monolithic body; a cap die, forming an ASIC, bonded to and facing the first face of the monolithic body; and a first gap between the cap die and the monolithic body. The device also comprises at least one spacer element between the monolithic body and the cap die; at least one stopper element between the monolithic body and the cap die; and a second gap between the stopper element and one between the monolithic body and the cap die. The second gap is smaller than the first gap.

13 Claims, 16 Drawing Sheets

(52) U.S. Cl.
CPC .............. *B81C 2203/0792* (2013.01); *H01L 2224/48479* (2013.01); *H04R 2201/003* (2013.01)

(56) References Cited

U.S. PATENT DOCUMENTS

| | | |
|---|---|---|
| 8,173,513 B2 | 5/2012 | Villa et al. |
| 9,233,834 B2 | 1/2016 | Faralli et al. |
| 9,688,531 B2 | 6/2017 | Baldo et al. |
| 2006/0203326 A1 | 9/2006 | Fu |
| 2008/0224242 A1 | 9/2008 | Villa et al. |
| 2009/0115008 A1 | 5/2009 | Ziglioli et al. |
| 2010/0096714 A1* | 4/2010 | Nakatani .............. G01L 9/0042 257/419 |
| 2010/0164025 A1 | 7/2010 | Yang |
| 2010/0284553 A1 | 11/2010 | Conti et al. |
| 2010/0330721 A1 | 12/2010 | Barlocchi et al. |
| 2014/0299949 A1* | 10/2014 | Conti .................... B81B 7/0061 257/416 |
| 2015/0001651 A1 | 1/2015 | Faralli et al. |
| 2016/0119722 A1* | 4/2016 | Chu ..................... H04R 19/005 257/416 |
| 2016/0167945 A1* | 6/2016 | Chang ................... B81B 3/001 257/415 |
| 2016/0318757 A1* | 11/2016 | Chou ................ B81C 1/00595 |
| 2016/0347606 A1* | 12/2016 | Bruno ................. B81B 7/0058 |
| 2017/0253477 A1 | 9/2017 | Baldo et al. |
| 2018/0127263 A1* | 5/2018 | Tai ......................... B81B 3/001 |

\* cited by examiner

MICRO-ELECTRO-MECHANICAL DEVICE HAVING TWO BURIED CAVITIES AND MANUFACTURING PROCESS THEREOF

BACKGROUND

Technical Field

The present disclosure relates to a process for manufacturing MEMS (Micro-Electro-Mechanical System) devices having two buried cavities and to the micro-electro-mechanical device.

Description of the Related Art

As is known, sensors including micromechanical structures made, at least in part, of semiconductor materials employing MEMS technology are increasingly widely used, due to their advantageous characteristics of small dimensions, low manufacturing costs, and flexibility.

A MEMS sensor generally comprises a micromechanical sensing structure, which transduces a physical or mechanical quantity to be detected into an electrical quantity (for example, correlated to a capacitive variation); and an electronic reading circuit, usually formed as an ASIC (Application-Specific Integrated Circuit), which carries out processing operations (i.e., amplification and filtering) of the electrical quantity and supplies an electrical output signal, either analog (for example, a voltage) or digital (for example a PDM—Pulse Density Modulation—signal). The electrical signal, possibly further processed by an electronic interface circuit, is then made available to an external electronic system, for example a microprocessor control circuit of an electronic apparatus incorporating the sensor.

MEMS sensors comprise, for example, sensors for detecting physical quantities, such as inertial sensors, which detect acceleration or angular velocity data; sensors of derived signals, such as quaternions (data representing rotations and directions in three-dimensional space), gravity signals, etc.; motion sensors, such as step counters, running sensors, uphill sensors, etc.; and environmental signals, which detect quantities such as pressure, temperature, and humidity.

To sense the physical/mechanical quantity, MEMS sensors of the considered type comprise a membrane or a mass formed in or on a semiconductor chip and suspended over a first cavity. The membrane may face the external environment or be in communication therewith via a fluidic path.

U.S. Pat. No. 9,233,834 describes, for example, a MEMS device wherein a sensitive part of the device that forms the membrane is separated from the rest of the chip and supported by springs. The springs decouple the sensitive part from the rest of the chip and absorb the package stress, without transferring it to the sensitive part. In this device, the sensitive part is housed within or faces a second cavity that enables a limited movement of the sensitive part with respect to the rest of the chip.

In practice, the device has two cavities, where a first cavity defines the membrane and a second cavity enables decoupling of the sensitive part of the device from the rest. In the known device, to obtain the two cavities, two semiconductor wafers are used, which are bonded together. If the device is provided with a cap, this is formed in a third wafer, which is also bonded, as discussed hereinafter with reference to FIGS. 1 and 2.

FIG. 1 shows in a simplified way a MEMS sensor 1 formed in a chip 10 of semiconductor material, such as silicon. A cap 11 is fixed to a first face 10A of the chip 10, and a closing region 12 is fixed to a second face 10B of the chip 10 via spacers 26.

The chip 10 comprises a suspended region 13 separated from a peripheral portion 18 of the chip 10 through a trench 14. Elastic elements (also referred to as springs 15) support the sensitive region 13 and connect it mechanically to the peripheral portion 18. The sensitive region 13 houses a buried cavity 16 delimiting a membrane 19. The term "buried cavity" herein refers to an empty area (or an area filled with gas) within a semiconductor material body or chip, which extends at a distance from the two main faces of the body, being separated from these faces by portions of semiconductor and/or dielectric material.

A second cavity 21 extends underneath the sensitive region 13. The sensitive region 13 is provided with a stem 20 (also referred to as Z stopper) extending in the second cavity 21 and limiting oscillation of the sensitive region 13 in the event of impact or stresses that might damage the springs 15.

The cap 11 covers here at the top the entire first face 10A of the chip 10 and protects the latter from the external environment. The cap 11 is fixed via bonding regions 22, for example of metal such as gold, tin, or copper, or polymeric material or a glass material (glass-frit), fixed to the peripheral portion 18 and is thus spaced apart by a gap 23 from the first face 10A due to the thickness of the bonding regions 22. Further, the cap 11 has a through hole 24, which fluidically connects the membrane 19 to the environment that surrounds the chip 10.

The closing region 12 has a protection function during handling of the MEMS sensor 1 (for example, during transport to an assembly system). In general, the closing region 12 is constituted by a second chip housing electronic components, such as an ASIC, but may be constituted by another support, such as a printed-circuit board, or the like. Generally, the closing region 12 has a containment trench 17, to prevent material of the bonding regions 26 from reaching the mobile parts, limiting movement thereof in an undesired way.

By virtue of the second cavity 21, the sensitive region 13 bearing the sensitive part of the MEMS sensor (membrane 19) is free to move within certain limits in a vertical direction (perpendicular to the main extension plane of the chip 10 and thus to the faces 10A, 10B thereof) and is not affected by stress during manufacturing, in particular during packaging, in so far as the sensitive region 13 is mechanically decoupled from the peripheral portion.

The device of FIGS. 1 and 2 is formed by bonding three wafers together. In particular, initially (FIG. 3A) a first wafer 350 of monocrystalline silicon is processed for forming the buried cavities 16 delimiting the membranes 19 at the bottom. Formation of the buried cavities 16 may take place in various ways, for example as described in U.S. Pat. No. 8,173,513. Further, on a first face 350A of the first wafer 350 a gold layer is deposited so as to form first bonding and electrical-connection structures 351. In addition, the first wafer 350 is etched from the front using a silicon etching for laterally defining the trenches 14 and the springs 15.

In parallel, before or after (FIG. 3B), a second wafer 400 of monocrystalline silicon is provided with second bonding and electrical-connection structures 401 having a shape and dimensions that are congruent with those of the first bonding and electrical-connection structures 351. Next, using a resist mask, a deep silicon etch is carried out to form holes 403 and trenches 404. Etching is prolonged so that both the holes 403 and the trenches 404 have a greater depth than the thickness intended for the cap 11 (FIG. 1).

Then (FIG. 3C), the second wafer 400 is flipped over and fixed to the first wafer 350 via a wafer-to-wafer bonding process of a known type, to obtain a composite wafer 500.

Next (FIG. 3D), the first wafer 350 is thinned out from the back, to form the second cavities 21 and the stems 20, and is etched once again from the back, to release the suspended regions 13 and the springs 15. In addition, the second wafer 400 is thinned out until the bottom of the holes 403 and of the trenches 404 is reached.

After bonding a third wafer 410 and dicing the composite wafer 500 of FIG. 3D, the MEMS sensor 1 of FIG. 1 is thus obtained.

Consequently, in the process described, the MEMS device 1 is obtained by bonding three different wafers.

Thus, its thickness is considerable. Further, the process is rather complex in so far as it specifies bonding of three wafers.

BRIEF SUMMARY

One or more embodiments are directed to a MEMS device having two cavities and the manufacturing process thereof.

According to one embodiment a micro-electro-mechanical device is provided. The micro-electro-mechanical device comprises a monolithic body of semiconductor material having a first face and a second face. A first buried cavity is in the monolithic body and a sensitive region is in the monolithic body facing the first buried cavity. The device comprises a movable element over a second cavity that faces the first buried cavity. The device comprises a decoupling trench extending from the first face of the monolithic body as far as the first buried cavity. The decoupling trench separates the sensitive region from a peripheral portion of the monolithic body.

In at least one embodiment, the second cavity is buried in the sensitive region and the movable element is a membrane in the sensitive region and arranged between the second cavity and the first face. In another embodiment, the movable element and second cavity are spaced apart from the first face of the monolithic body and the movable element is supported by a structural element that is coupled to the first face of the monolithic body.

In yet another embodiment, the device comprises a cap die directly coupled to the first face of the monolithic body. The device also comprises a first gap between the monolithic body and the cap die; at least one spacer element between the monolithic body and the cap die; and at least one stopper element on one between the monolithic body and the cap die. In addition, the device comprises a second gap between the stopper elements and one between the monolithic body and the cap die, the second gap being smaller than the first gap.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

The present manufacturing process will be described hereinafter with reference to manufacturing a single sensitive structure, it being understood that it is replicated a number of times in a wafer, prior to dicing the wafer, in a per se known manner to the person skilled of the art.

Figure 1:
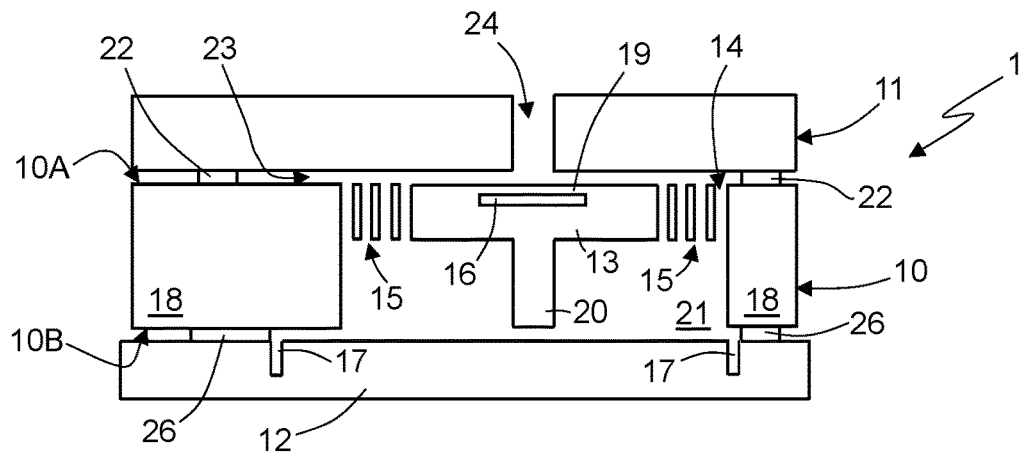
FIGS. 1 and 2 are, respectively, a cross-section and a top view of a known MEMS sensor.
Figure 2:
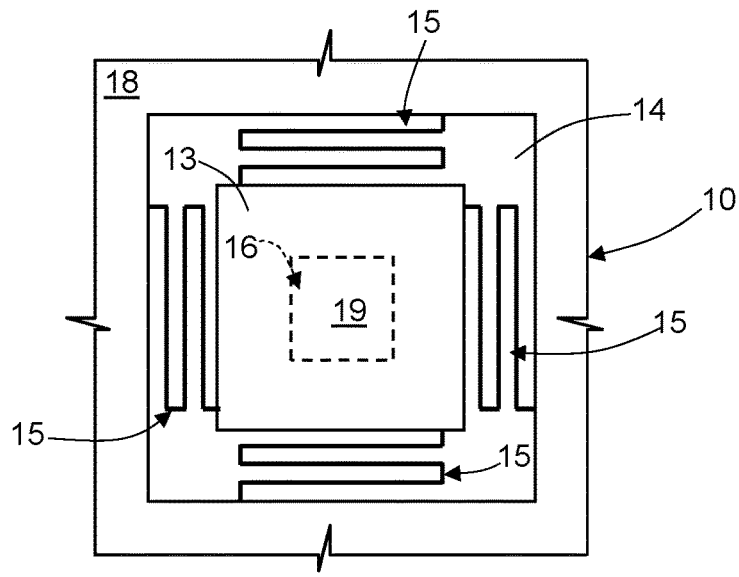
Figure 3A:
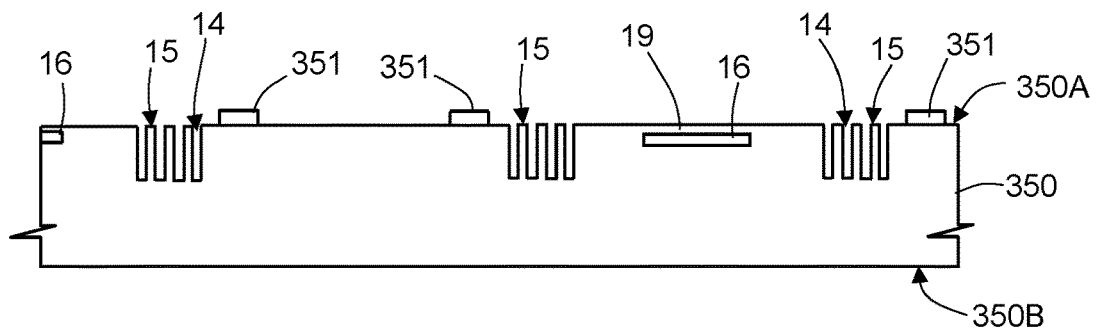
FIGS. 3A-3D are cross-sections of successive manufacturing steps of the MEMS sensor of FIG. 1.
Figure 3B:
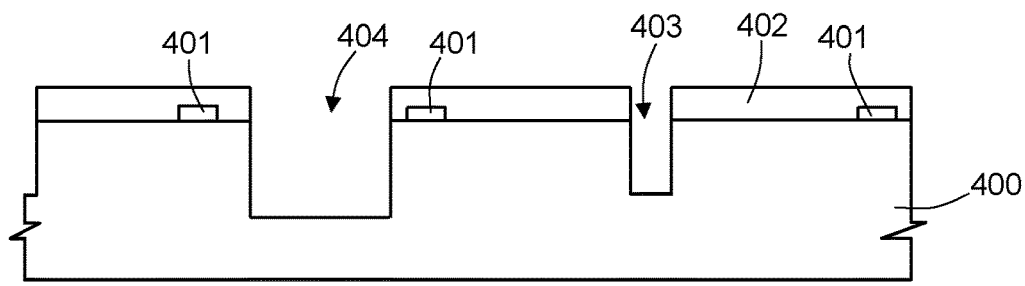
Figure 3C:
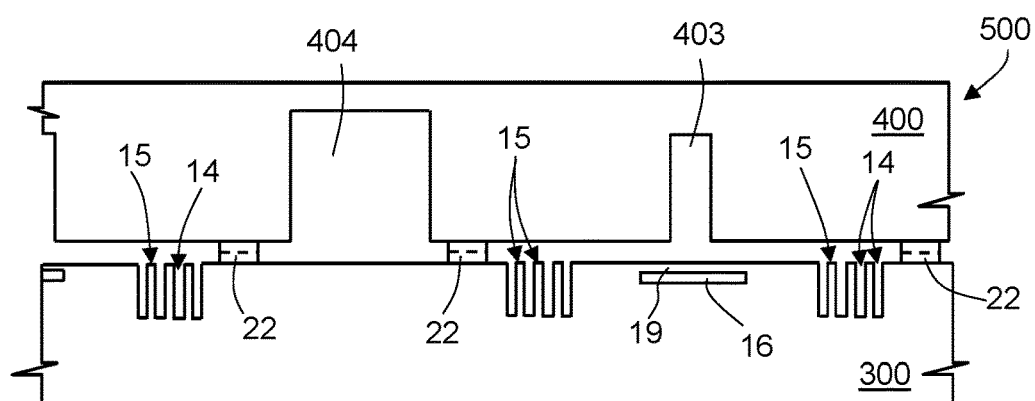
Figure 3D:
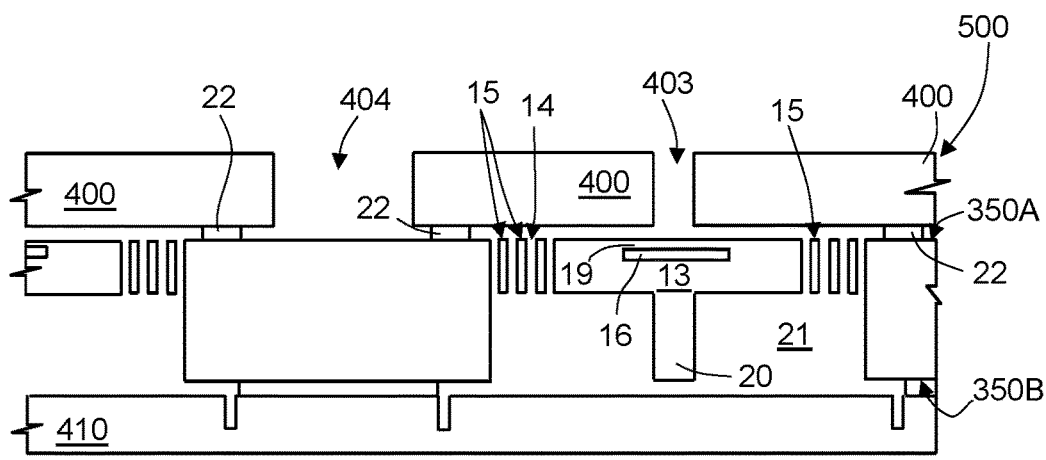
Figure 4A:
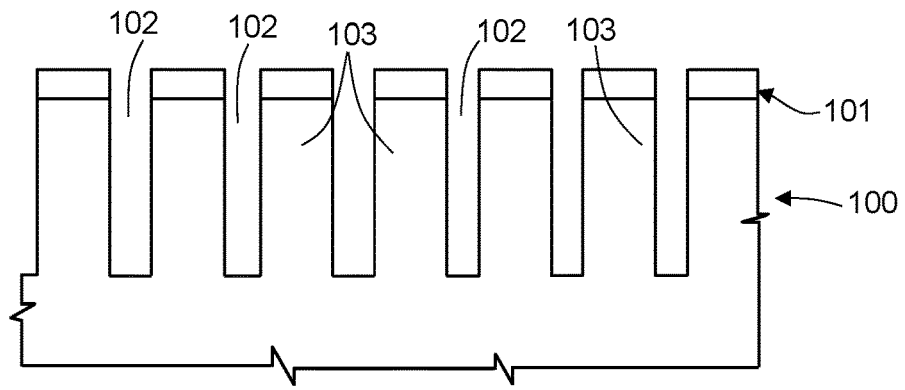
FIGS. 4A-4F show cross-sections of successive steps of an embodiment of the present manufacturing process.

Initially (FIG. 4A), a buried cavity is formed in an initial wafer 100 of semiconductor material. For example, to this end, the manufacturing process described in U.S. Pat. No. 8,173,513 and summarized briefly hereinafter may be used.

In detail, on the initial wafer 100, a resist mask 101 is formed having openings arranged according to a honeycomb configuration. Using the mask 101, the initial wafer 100 is anisotropically etched for forming a plurality of trenches 102, communicating with each other and delimiting a plurality of silicon columns 103.

Figure 4B:
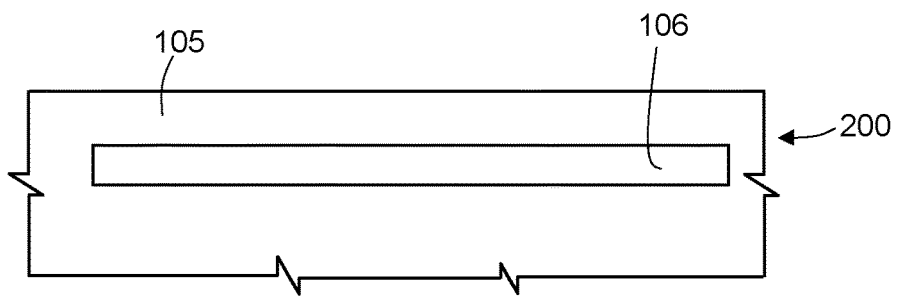

With reference to FIG. 4B, the mask 101 is removed and an epitaxial growth is carried out in reducing environment. Consequently, an epitaxial layer, for example of an N type with a thickness of 30 μm, grows above the columns 103, closing the trenches 102 at the top and forming a first intermediate wafer 200.

A thermal annealing is carried out, for example for 30 minutes at 1190° C., preferably in hydrogen atmosphere, or, alternatively, in nitrogen atmosphere.

As discussed in the patents referenced above, annealing causes migration of the silicon atoms, which tend to move into a lower-energy position. Consequently, and also by virtue of the short distance between the columns 103, the silicon atoms of the latter migrate completely, and a first buried cavity 106 is formed. A thin silicon layer remains above the first buried cavity 106 and is formed in part by epitaxially grown silicon atoms and in part by migrated silicon atoms and forms a monosilicon closing layer 105.

In the embodiment shown (FIG. 4C), another epitaxial growth is carried out, of an N type or else a P type and of thickness of a few tens of micrometers, for example 50 μm, starting from the closing layer 105. A second intermediate wafer 201 is thus formed, which includes a first thick monosilicon region 108 that overlies the first buried cavity 106.

Figure 4C:
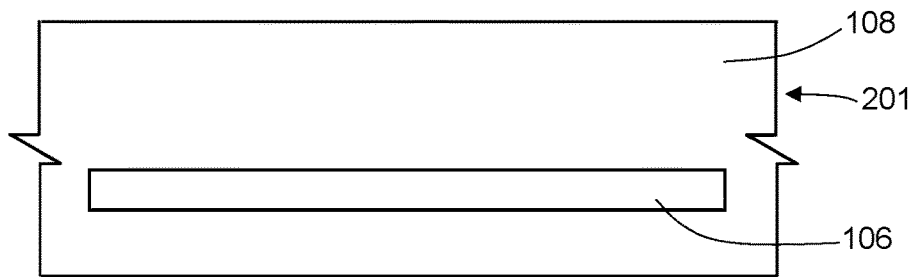
Figure 4D:
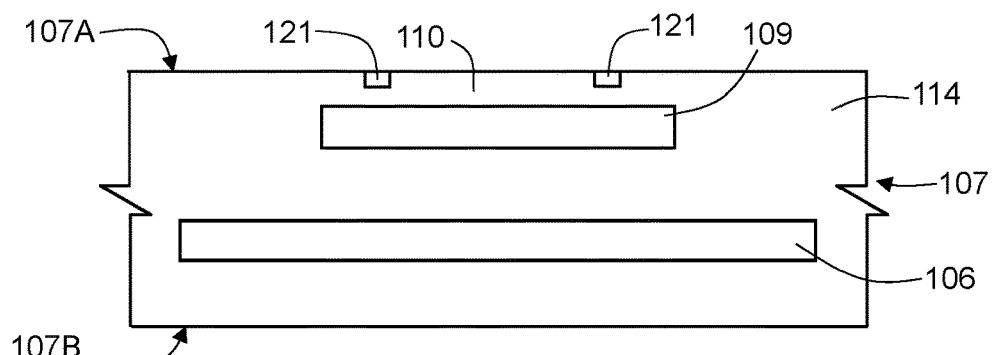

With reference to FIG. 4D, a second cavity 109 is formed in the first thick region 108, for example repeating the manufacturing process described in U.S. Pat. No. 8,173,513 (see also FIGS. 4A and 4B). In this way, a sensor wafer 107 is formed having a first and a second face 107A, 107B and, above the first cavity 106, a second thick region 114. The second thick region 114 accommodates a second cavity 109 and a membrane 110, which is delimited at the bottom of the second cavity 109 and faces the first face 107A. The second thick region 114 has, for example, a thickness of approximately 50 µm, and the membrane 110 has, for example, a thickness of approximately 10 µm.

If the application so specifies, electronic components 121 may be provided in the membrane 110, for example piezoresistors, via diffusion or implantation of dopant ion species, here of a P type, in a known manner and not shown. Further, in a per se known manner, electrical interconnections (not shown) may be provided on the first face 107A of the sensor wafer 107.

Figure 4E:
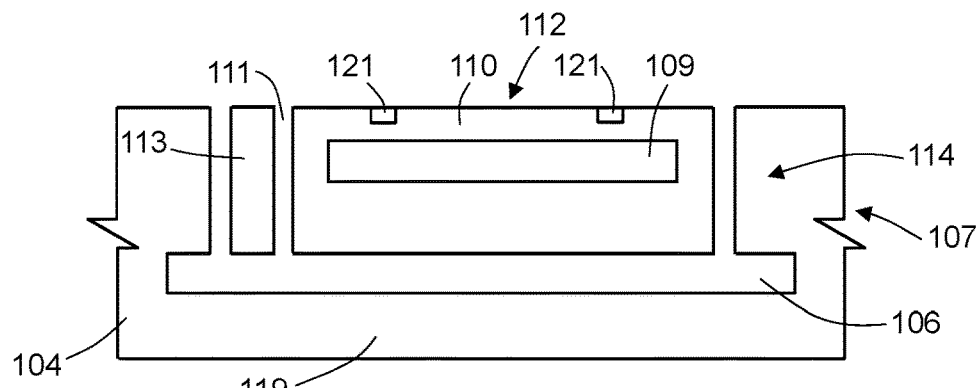
Figure 5:
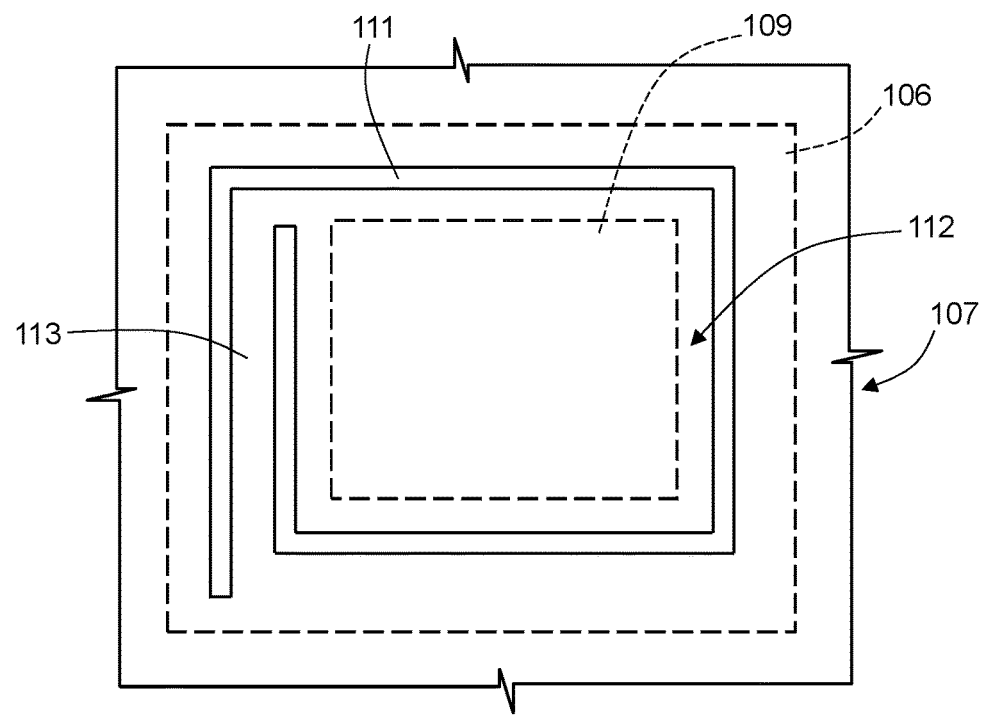
FIG. 5 is a top view of a detail of the wafer formed in step 4E of the present process.

With reference to FIG. 4E, using a masking layer (not shown), a deep silicon etch is carried out through the second thick region 114 until the first cavity 106 is reached. A trench 111 is thus formed, external to and surrounding the second cavity 109. In particular, in the embodiment shown, the trench 111 has the shape of a square spiral. In this way, as may be seen in the top view of FIG. 5, the trench 111 is formed by five sides delimiting a sensitive portion 112, and an arm or spring 113 connecting the sensitive portion 112 to the rest of the sensor wafer 107 (peripheral portion 104 and base 119).

A cap wafer 115 is fixed to the first face 107A of the sensor wafer 107. To this end, for example, bonding regions 116, for instance, of metal such as gold, tin, or copper, or of polymeric material or a glass based material (glass-frit) may be applied previously to the cap wafer 115 and/or to the sensor wafer 107. In this way, it is possible to electrically connect the electronic components 121, integrated in the second wafer 107, with conductive structures (not illustrated) in or on the cap wafer 115. The bonding regions 116 further form spacers between the first face 107A of the sensor wafer 107 and the cap wafer 115, thus delimiting a gap 117.

In the embodiment shown, the cap wafer 115 has a through hole 118 that enables fluidic connection between the gap 117 and the external environment and detection, by the membrane 110, of the external pressure.

The cap wafer 115 may further be provided with holes (not shown) for bonding wires (not shown). Alternatively, in a way not shown either, through-silicon vias (not shown) may be provided in the peripheral portion 104 of the sensor wafer 107 for electrical connection of the electrical components 121 with the second face 107B of the sensor wafer 107.

After dicing the sensor wafer 107 into a plurality of MEMS devices 120, each of them may be fixed to a support (not shown), for example an ASIC. Alternatively, the sensor wafer 107 may be fixed to a further wafer, prior to dicing, or to a printed-circuit board, in a way not shown.

According to a different embodiment, the second cavity may be formed via removal of a sacrificial layer.

In this case, the manufacturing process may comprise the same initial steps as those described above with reference to FIGS. 4A-4C.

Figure 6A:
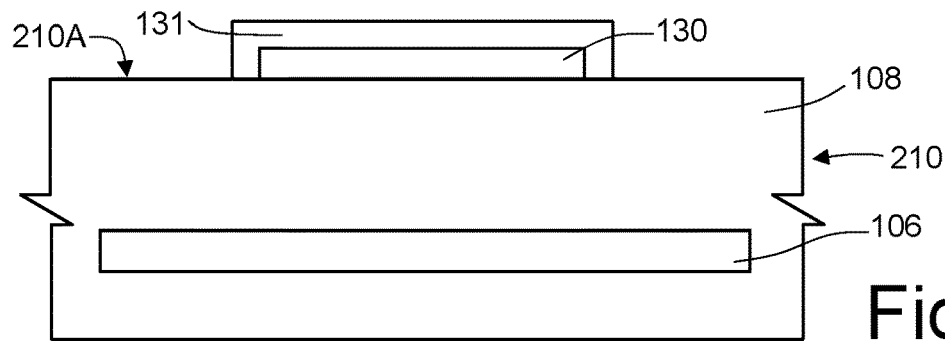
FIGS. 6A-6D are cross-sections of successive steps of another embodiment of the present manufacturing process.

Thus, starting from the structure of FIG. 4C, where the first cavity 106 has already been formed in the second intermediate wafer 201, a sacrificial region 130 is formed on the first thick region 108. The sacrificial region 130 is formed, for example, by depositing a sacrificial layer (for instance, of silicon oxide) and its definition via known photolithographic techniques (FIG. 6A). A structural layer 131 is deposited over the sacrificial region 130, for example a polycrystalline silicon layer grown by CVD, to form a sensor wafer 210 having a first, non-planar, face 210A, comprising a projecting area, corresponding to the structural layer 131, and a lowered area, corresponding to the exposed portion of the first thick region 108.

Figure 6B:
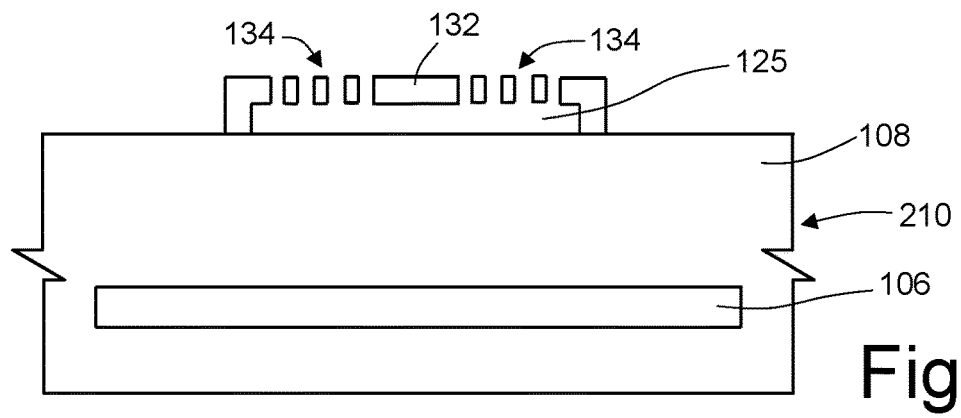
Figure 7:
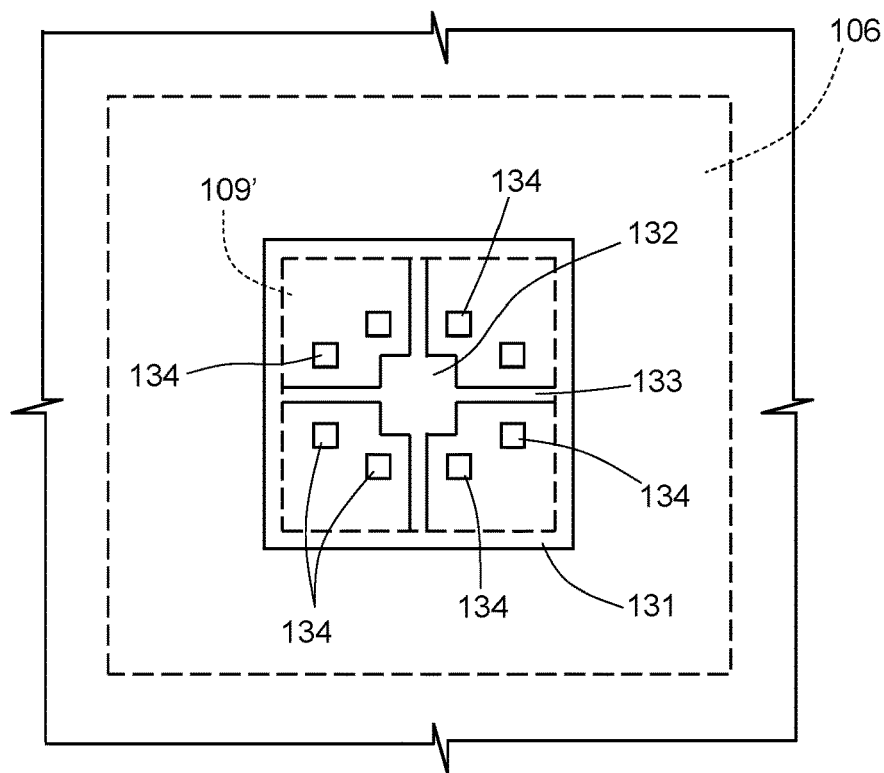
FIG. 7 is a top view of a detail of the wafer formed in step 6B of the present process.

With reference to FIG. 6B, the structural layer 131 is etched to define a micro-electro-mechanical structure of an inertial type, for example an accelerometer. In this case, as may be seen in the top view of FIG. 7, a suspended mass or platform 132, springs 133, connecting the platform 132 to the rest of the structural layer 131, and mobile and fixed electrodes 134, represented only schematically in FIG. 7, are defined.

The sacrificial region 130 is removed by etching the sacrificial material, for example in hydrofluoric acid for releasing the platform 132 and the mobile electrodes, thereby obtaining the structure of FIG. 6B, where a second cavity 125 extends underneath the platform 132.

Figure 6C:
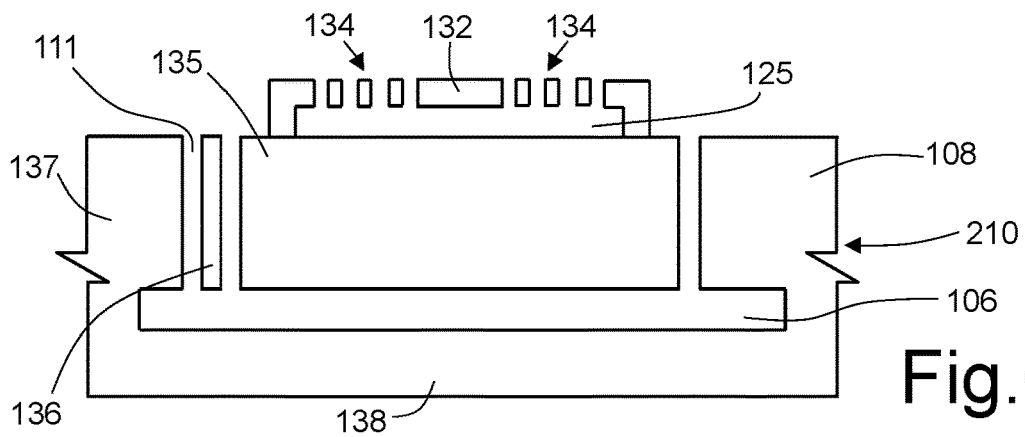
Figure 6D:
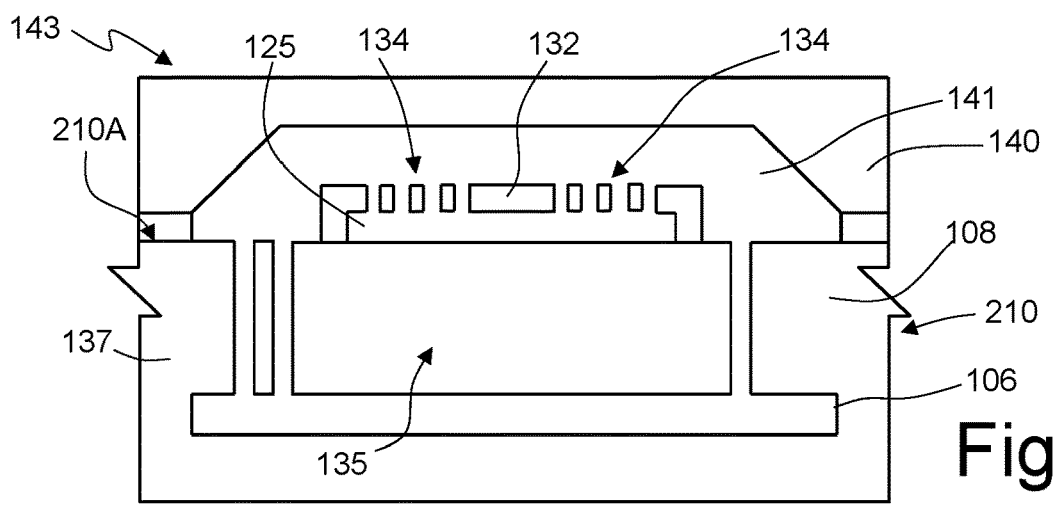
Figure 8:
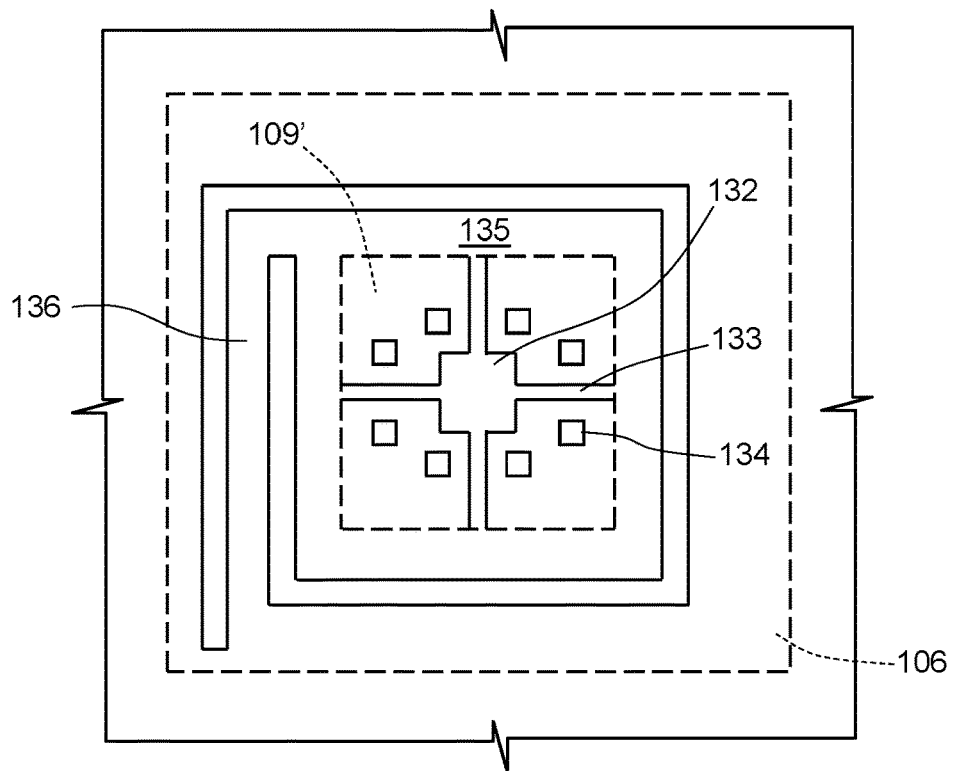
FIG. 8 is a top view of a detail of the wafer formed in step 6C of the present process.

Subsequently or previously, for example using a dry film (FIG. 6C) and analogously to what described with reference to FIG. 4E, using a masking layer (not shown) a deep silicon etch is made through the first thick region 108, outside the area of the structural layer 131, and thus outside the platform 132, until the first cavity 106 is reached. The trench 111 is thus formed, which, in top view (see FIG. 8) surrounds the second cavity 125 and the platform 132. Also here, the trench 111 has the shape of a square spiral and comprises five sides delimiting a sensitive portion 135, and an arm or spring 136 connecting the sensitive portion 135 to the rest of the sensor wafer 210, hereinafter also indicated as peripheral portion 137.

Figure 4F:
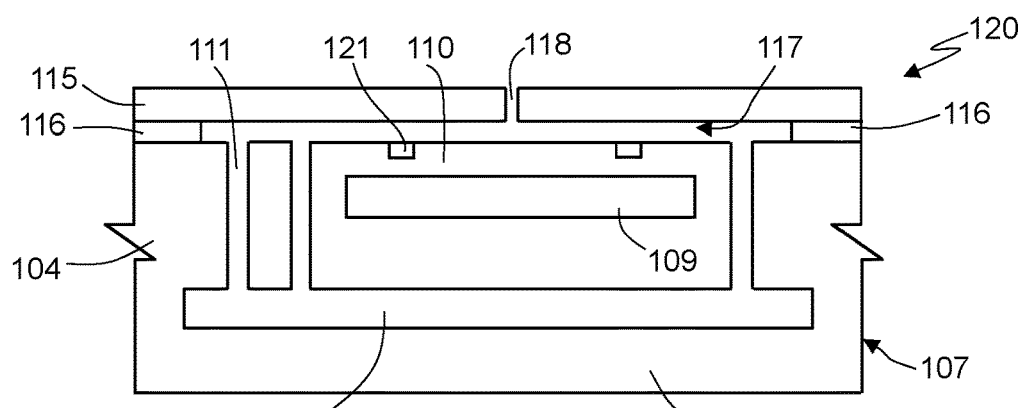

A cap wafer 140 is fixed to the first face 210A of the sensor wafer 210 analogously to what described with reference to FIG. 4F. In this case, since the surface 210A of the sensor wafer 210 is not planar and the platform 132 projects above the thick region 108, the cap wafer 140 has a recess 141 facing the sensitive region 135.

Also in this case, the cap wafer 140 may have holes (not shown) for passage of bonding wires, or, in a way not shown, through-silicon vias may be provided in the peripheral portion 137.

The sensor wafer 210 is diced into a plurality of MEMS devices 143, and, analogously to what already described, each of them may be bonded to a support or the sensor wafer 210 may be fixed to a further wafer, prior to dicing.

In a different embodiment (FIG. 9), the cap is formed directly by an ASIC, and the hole for connection to the external environment is formed directly in the sensor wafer, instead of in the cap.

In the embodiment shown, the sensor wafer 107 of FIG. 4E is used. The base portion 119 of the sensor wafer 107, underneath the first cavity 106 in the view of FIG. 4E, is here perforated by a deep silicon etch, analogous to the trench 111 etching. A connection hole 145 is thus obtained and connects the first cavity 106 to the external environment.

First stoppers 146, for example of dielectric material, such as silicon oxide, or metal material or polysilicon or a stack of different material layers, deposited and defined on the first face 107A, in a per se known manner, are further formed on the first face 107A of the sensor wafer 107.

Second stoppers 147 are formed on a face 150A of an ASIC wafer 150, in a position so as to face, at a distance, the first stoppers 146.

Spacer elements 151 as well as mechanical and electronic connection elements 152 are formed on the ASIC wafer 150 or on the sensor wafer 107.

The spacers 151 may be of materials including gold, copper, tin, glass-frit or polymers and may have a thickness of 5 μm.

The mechanical and electronic connection elements 152 may, for example, be formed by so-called "solder balls," arranged at contact pads 153A, 153B formed on the first face 107A of the sensor wafer 107 and a face 150A of the ASIC wafer 150.

The sensor wafer 107 and the ASIC wafer 150 are bonded together, with the first face 107A of the sensor wafer and the face 150A of the ASIC wafer 150 facing each other, thereby forming a composite wafer. Finally, the composite wafer is diced into a plurality of finished devices 160.

As an alternative to the above, the connection hole 145 may be formed at the end of the process, prior to dicing the composite wafer.

In this way, between the two faces 107A and 150A a gap 154 is formed, the thickness thereof is defined by the spacer elements 151, and the sensitive portion 112 may move in a limited way within the gap 154 or the first cavity 106, and is thus decoupled from the peripheral portion 104.

In addition, the membrane 110 is connected to the external environment through the trench 111, the first cavity 106, and the hole 145, thus forming a fluidic path.

The mechanical and electronic connection elements 152 enable, in addition to bonding the sensor wafer 107 and the ASIC wafer 150, their electrical connection.

As an alternative to the above, the sensor wafer 107 and/or the ASIC wafer 150 may be diced prior to bonding, in a per se known manner. Further, it is possible to form the cap and ASIC also starting from the structure of FIG. 6A, and thus with the second cavity 125 formed by removal of a sacrificial region.

Figure 10:
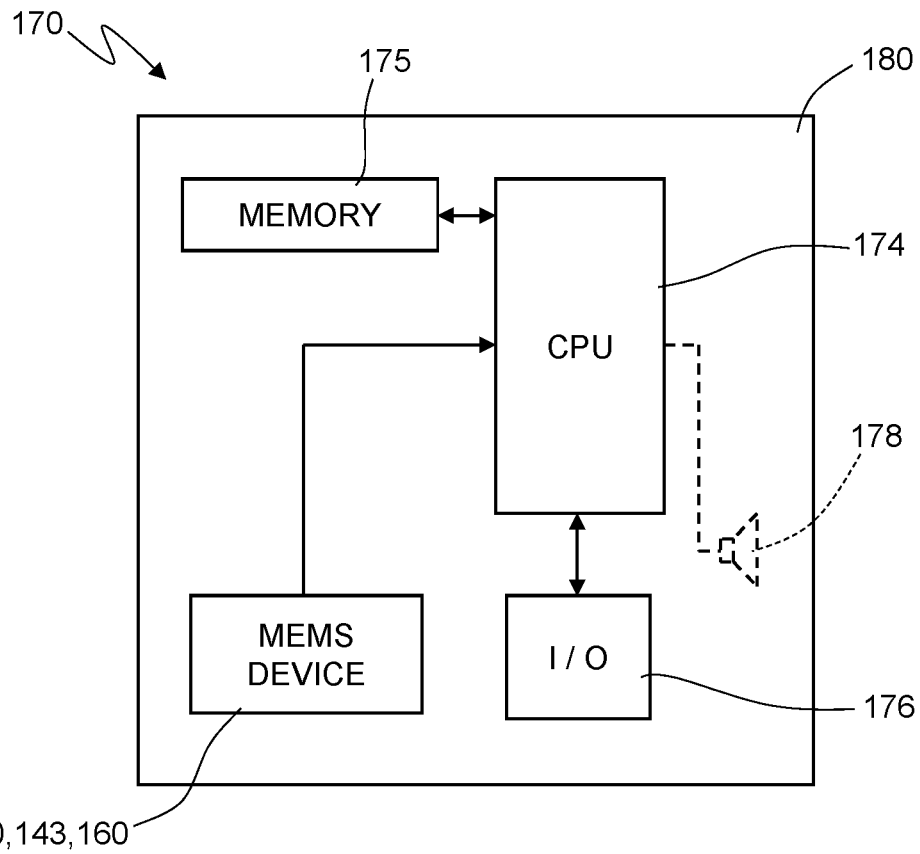
FIG. 10 shows an apparatus using the present MEMS device.

FIG. 10 is a schematic representation of an electronic apparatus 170 using the MEMS device 120, 143, 160.

The electronic apparatus 170 comprises, in addition to the MEMS device 120, 143, 160, a microprocessor 174, a memory block 175, connected to the microprocessor 174 and an input/output interface 176, also connected to the microprocessor 174. Further, a speaker 178 may be present for generating a sound on an audio output (not shown) of the electronic apparatus 170.

In particular, the electronic apparatus 170 is fixed to a supporting body 180, for example formed by a printed circuit.

The electronic apparatus 170 is, for example, an apparatus for measuring blood pressure (sphygmomanometer), a household apparatus, a mobile communication device (a cellphone, a PDA—Personal Digital Assistant—, or a notebook) or an pressure measuring apparatus that may be used in the automotive sector or in the industrial field in general.

In this way, the devices 120, 143, 160 may be formed with a lower number of wafers as compared to the devices currently produced, since both the cavities (i.e., the first cavity 106 and the second cavity 109 or 125) are formed in a same monolithic substrate, without bonding two wafers together.

In this way, the manufacturing costs are considerably reduced. Further, it is possible to reduce the thickness of the finished device, for a same robustness. Finally, it is possible to reduce problems of contamination and/or delimitation of the gluing materials, without forming specific containment trenches.

Figure 9:
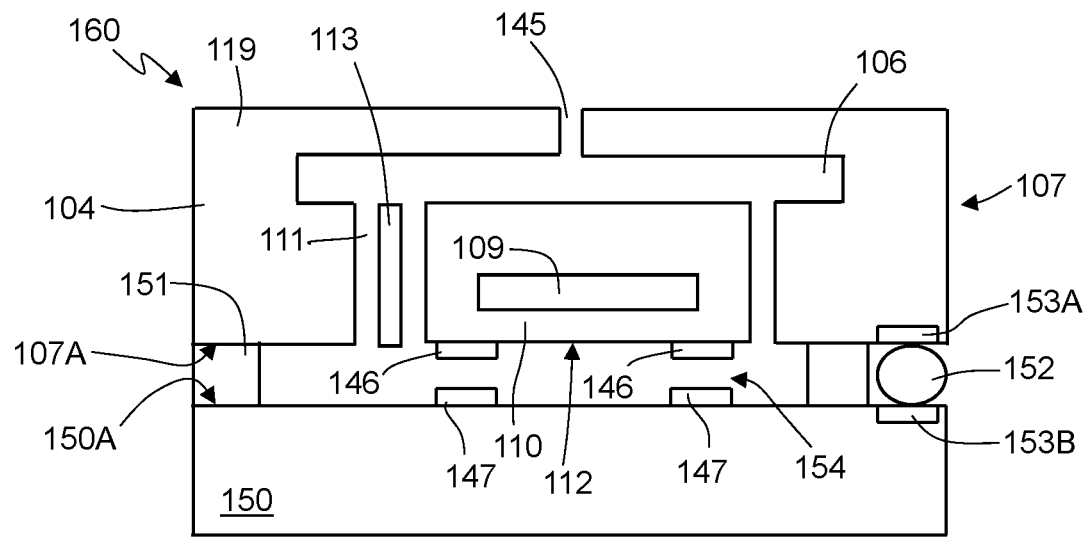
FIG. 9 is a cross-section of a different embodiment of the present MEMS device.
Figure 11:
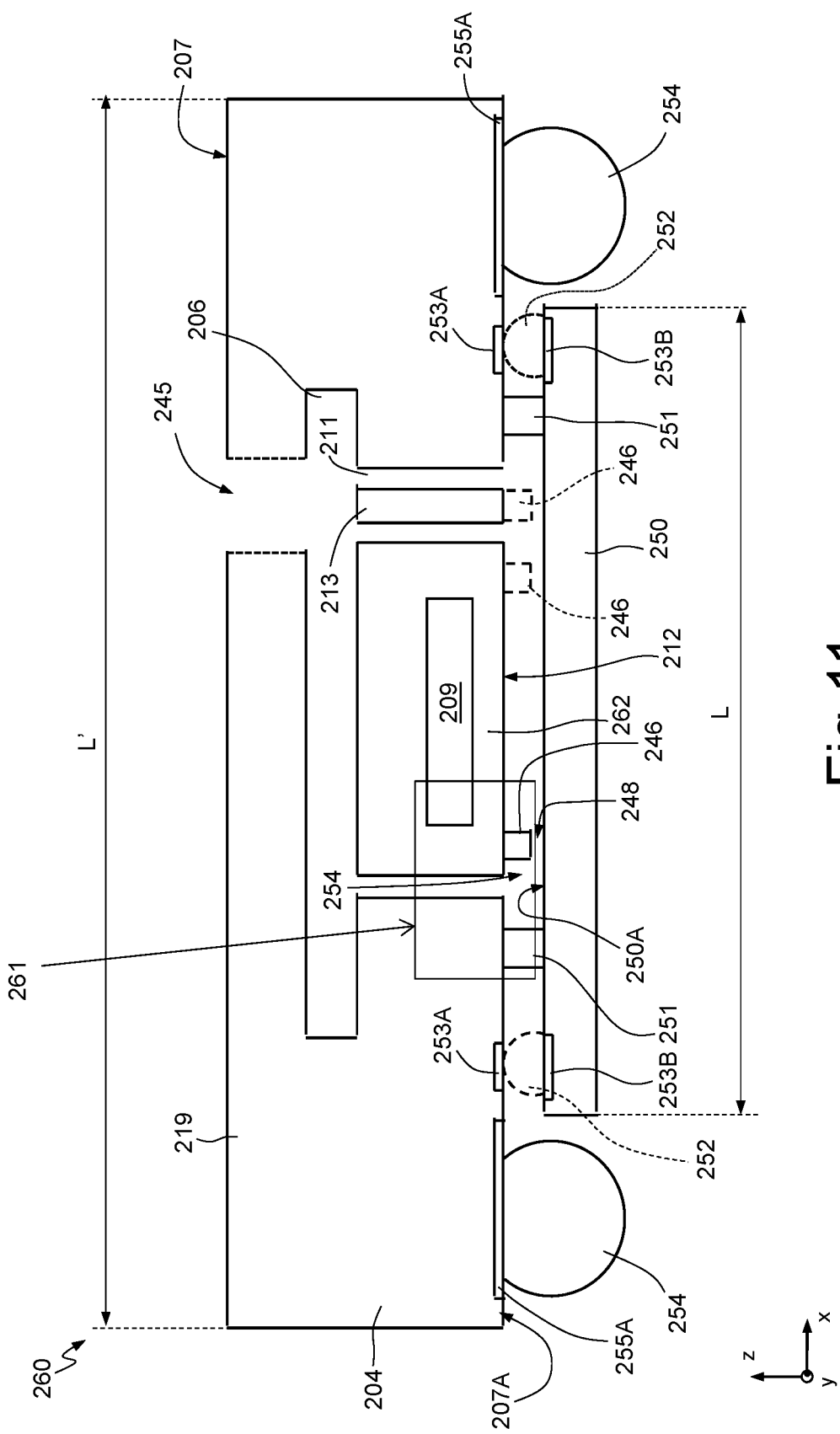
FIG. 11 shows a cross-section of yet another embodiment of the present MEMS device, taken along line XI-XI of FIG. 12.
Figure 12:
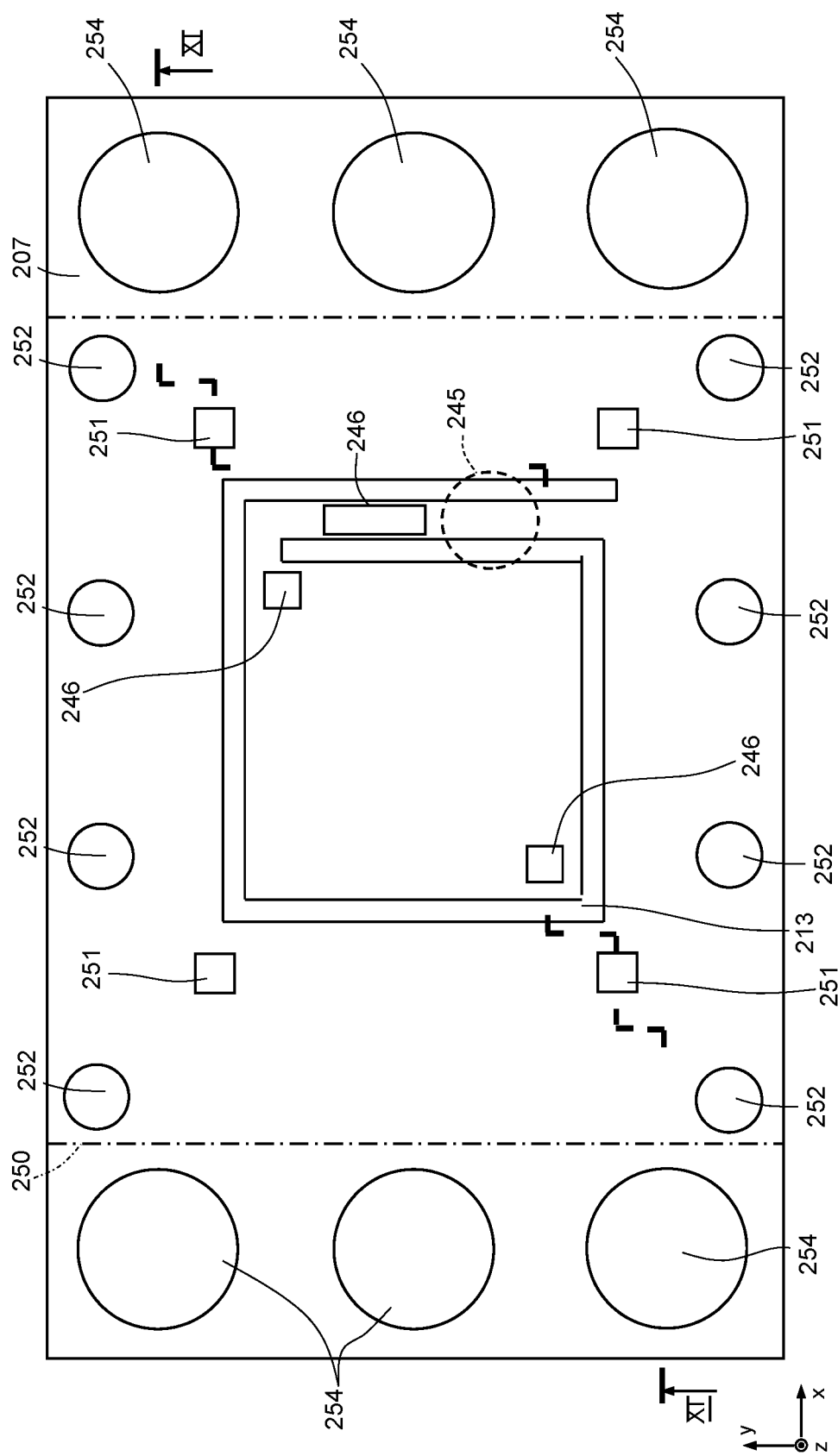
FIG. 12 shows a bottom view of the MEMS device of FIG. 11 with removed parts.

FIGS. 11 and 12 show a MEMS device 260 with a general structure similar to the one depicted in FIG. 9. Thus, elements similar to the ones shown and described in the device 160 of FIG. 9 will be indicated in FIGS. 11 and 12 with numbers increased by 100 and will not be described further.

In particular, the MEMS device 260 has a cap die 250 attached to a sensor die 207 and having an extension (referred to as L) along a direction parallel to a first axis X of a Cartesian reference system XYZ lower than the extension (referred to as L') of the sensor die 207.

In some embodiments, the cap die 250 is an ASIC (as previously disclosed in FIG. 9); in further embodiments, the cap die 250 is a substrate die having no components or having components for different functions.

In detail, in the shown embodiment, the sensor die 207 is analogous to the sensor wafer 107 of FIG. 4E, after dicing.

One or more stopper elements 246 are formed on the first face 207A of the sensor die 207 at the arm or spring 213 (for example, FIG. 12 shows four stopper elements 246). The stopper elements 246 are, for example, of dielectric material (such as silicon oxide) or metal (e.g., gold or copper, tin) or polysilicon or tin, glass-frit or polymers or a stack of different material layers and may have a thickness along a second axis Z of, for example, 8 μm.

Spacer elements 251 are formed on the first face 207A of the sensor die 207 and are of the same material as the stopper elements 246; moreover, the spacer elements 251 may have a thickness, for example, of 10 μm.

The stopper elements 246 and the spacer elements 251 are formed according to the manufacturing process illustrated in FIGS. 13A-13F.

Since the stopper elements 246 are less thick than the spacer elements 251, an internal gap 248 is formed between the stopper elements 246 and the face 250A of the cap die 250; consequently, the internal gap 248 may have an extension along the second axis Z of, for example, 2 μm.

In this way, the spacer elements 251 precisely set the height of the gap 254 and, thus, the sensitive portion 212 in the sensor die 207 may move in a limited way within the extension of the gap 254 or the first cavity 206 due to the limited distance between the sensor die 207 and the cap die 250.

First mechanical and/or electronic connection elements 252 are formed on a face 250A of the cap die 250. The first mechanical and/or electronic connection elements 252 may be, for example, formed by solder balls, arranged at first and second contact pads 253A, 253B formed on the first face 207A of the sensor die 207 and on the face 250A of the cap die 250, respectively. With reference to FIG. 12, the first mechanical and/or electronic connection elements 252 are disposed along two separate lines near two sides of the perimeter of the cap die 250, partially surrounding the sensitive portion 212.

In addition, second mechanical and/or electronic connection elements 254 are formed on the first face 207A of the sensor die 207. The second mechanical and/or electronic connection elements 254 may, for example, be formed by solder balls (made, e.g., of metal), arranged at third contact pads 255A formed on the first face 207A of the sensor die 207.

With reference to FIG. 12, wherein the cap die 250 is removed and represented by a thin line, the second mechanical and/or electronic connection elements 254 are arranged along two separate lines near two different sides of the perimeter of the sensor die 207.

Since the spacer elements 251 precisely set the height of the gap 254, when made of metal, it is clear that the spacers 251 should be made of a different metal from the one used for the first and second mechanical and/or electronic connection elements 252, 254, to avoid unwanted drawbacks in the soldering process.

In the embodiment of FIGS. 11-12, the stopper elements 246 are designed so to limit the movement of the sensitive portion 212 in case of a mechanical shock, thereby increasing the robustness of the MEMS device 260. In fact, as simulated by the Applicant, a 2 µm thickness for the stopper elements 246 ensures enough robustness against mechanical shocks for the sensitive portion 212 and, thus, the membrane 262, which is of same structure and function as membrane 210 as described above.

In addition, the cap die 250 also works as a protective cap for the sensing portion 212 of the sensor die 207.

In FIGS. 13A-13F the manufacturing process for both the stopper elements 246 and the spacer elements 251 of FIGS. 11 and 12 is described. FIGS. 13A-13F only show a portion of the MEMS device 260 as indicated by the box 261 in FIG. 11.

Figure 13A:
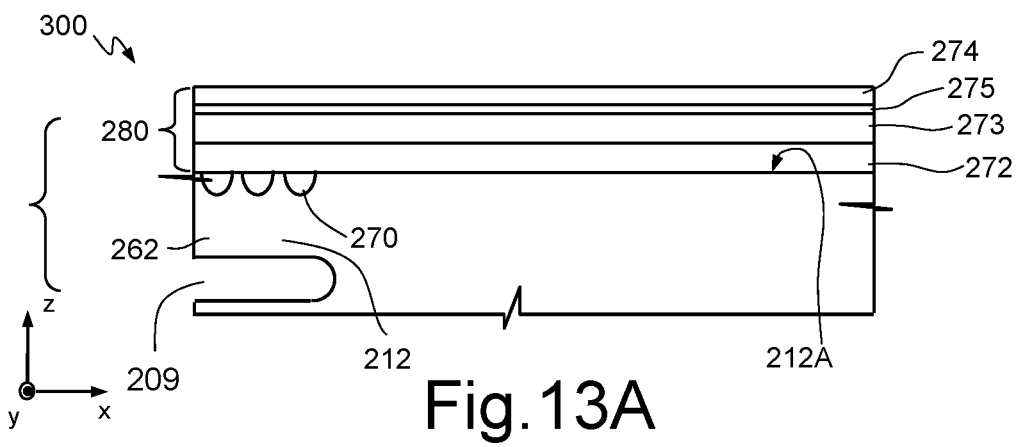
FIGS. 13A-13F show cross-sections of successive steps of the manufacturing process for stoppers of the MEMS device of FIGS. 11-12.

In FIG. 13A, a first wafer 300 has already been worked to form the sensitive portion 212 with the membrane 262 and the second cavity 209; in particular, the second cavity 209 has been formed using the process shown in FIGS. 4A-4D.

In addition, a plurality of piezoresistances 270 (three shown) have already been implanted in a per se known manner under an upper surface 212A of the sensitive portion 212. The plurality of piezoresistances 270 are arranged above the second cavity 209, in the membrane 262.

A first stack 280 including a plurality of layers of various dielectric materials has been formed on the upper surface 212A of the sensitive portion 212 in a per se known manner. In particular, a first dielectric layer 272 of, e.g., thermal oxide has been grown or deposited on the upper surface 212A; a second dielectric layer 273 of, e.g., TEOS (Tetra-EthylOrtoSilicate) has been deposited through LPCVD ("Low Pressure Chemical Vapor Deposition") technique; and a third dielectric layer 274 of, e.g., TEOS has been deposited through LPCVD technique. In detail, between the second and the third dielectric layers 273, 274, a metallization layer 275 is deposited using known deposition techniques; in particular, the metallization layer 275 is made of, for example, polysilicon with a thickness of, for example, 0.4-0.5 µm and is used to form an electrical connection between the sensor die 207 and the cap die 250.

Figure 13B:
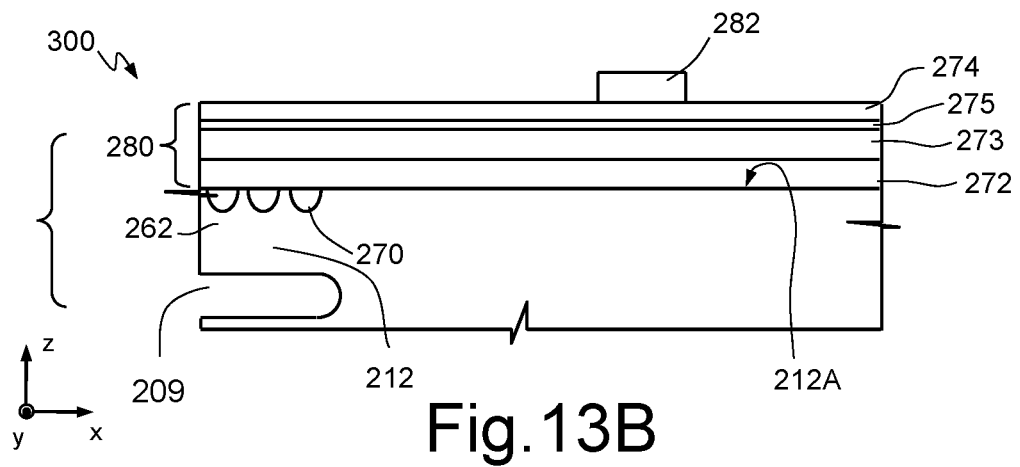

In FIG. 13B, a first step layer is deposited and defined through known deposition and photolithography techniques on the first stack 280, to form a first step 282. In particular, the first step 282 may be of polysilicon and of a thickness, for example, in a range between 0.5 µm and 2 µm.

Figure 13C:
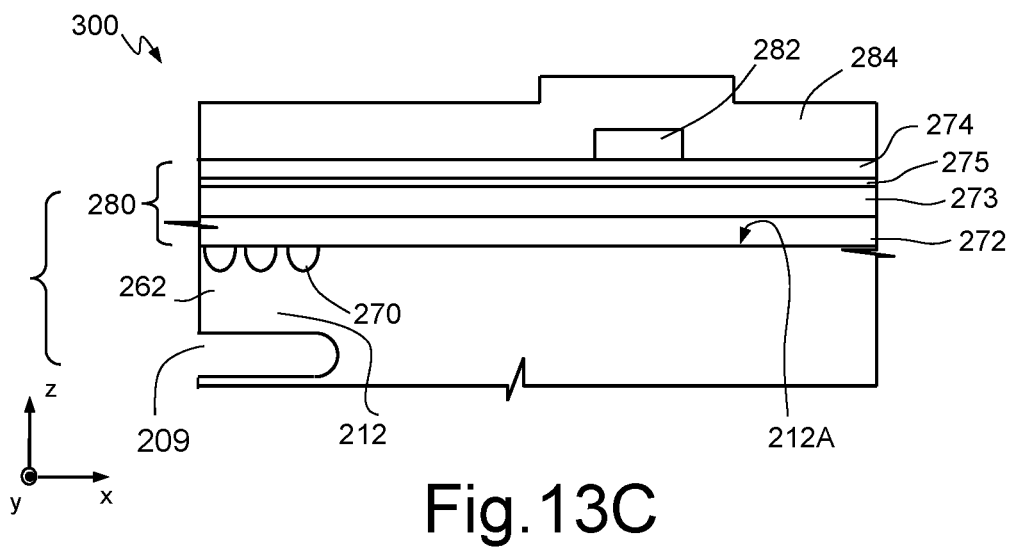
Figure 13D:
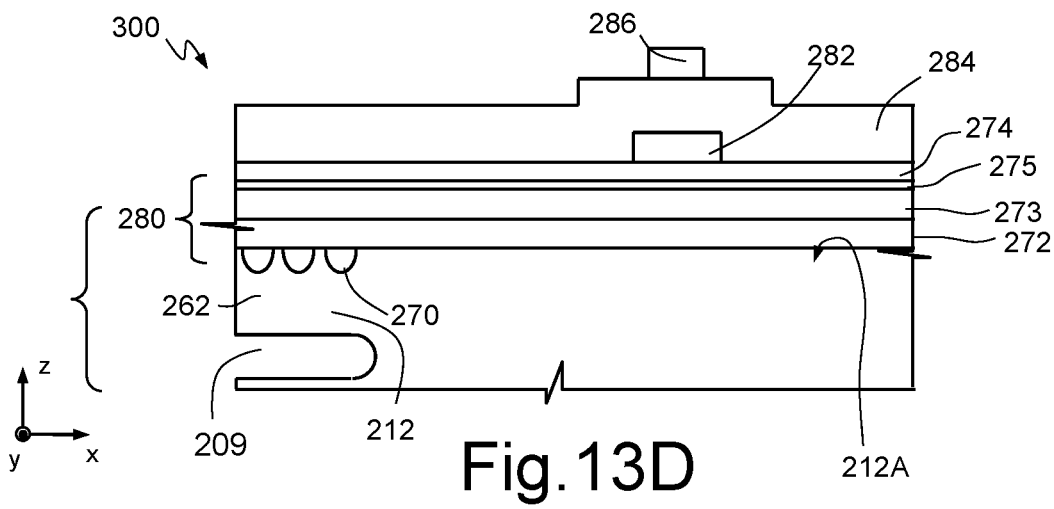

Hereafter, FIG. 13C, a fourth dielectric layer 284 of, e.g., BPSG (Boron Phosphate Silicate Glass) may be deposited through APCVD ("Atmospheric Pressure Chemical Vapor Deposition") technique; in particular, the process parameters are set so as to maintain the first step 282. The fourth dielectric layer 284 may have a thickness of, for example, 1 µm.

On the fourth dielectric layer 284 (FIG. 13D), a second step layer is deposited and defined in a per se known manner to form a second step 286; in particular, the second step 286 may be of metal and it is vertically aligned to the first step 282, so as to sum up to the first step 282 without adding further steps to the process flow. Moreover, the second step 286 may have a thickness, for example, in a range of 1-10 µm.

Figure 13E:
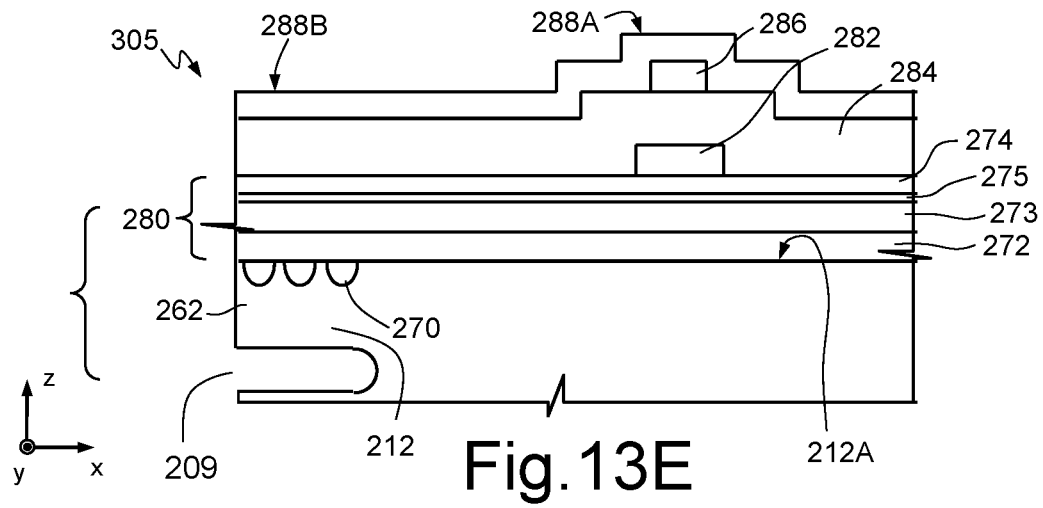

In FIG. 13E, a fifth dielectric layer 288 of, e.g., Silicon-Oxide-Nitride (Si—O—N) is deposited through PECVD ("Plasma Enhanced Chemical Vapor Deposition"); in particular, the process parameters are set such that the fifth dielectric layer 288 uniformly covers the second step 286 and the fourth layer 284. As a consequence, the fifth dielectric layer 288 comprises a raised portion 288A, which is vertically aligned with the first and the second steps 282, 286, and a flat portion 288B.

At the end of these manufacturing steps, a stepped wafer 305 is thus obtained.

Figure 13F:
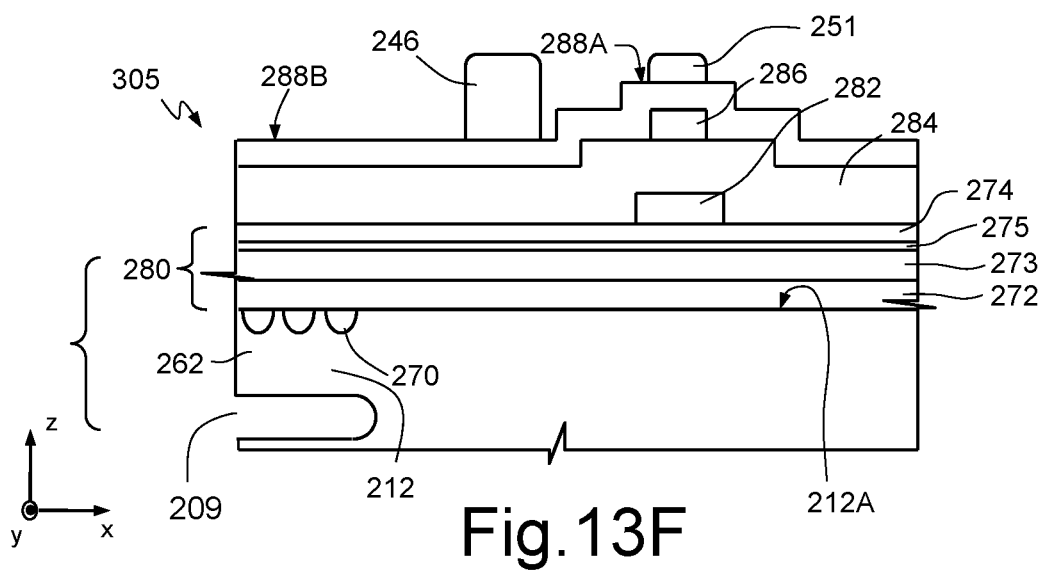

With reference to FIG. 13F, the stopper element 246 and the spacer element 251, when made of metal, are grown or deposited in a single step through electroplating technique; in particular, the spacer 251 is grown on the raised portion 288A of the fifth dielectric layer 288 and the stopper 246 is grown on the flat portion 288B of the fifth dielectric layer 288. In this way, both the stopper 246 and the spacer 251 are grown at the same time, and it is possible to precisely set the vertical position of the spacer element 251 with respect to the stopper element 246, e.g., to 2 µm.

After the manufacturing stage as shown in FIG. 13F, the manufacturing process continues as described above in reference to FIGS. 4E and 4F.

Figure 14:
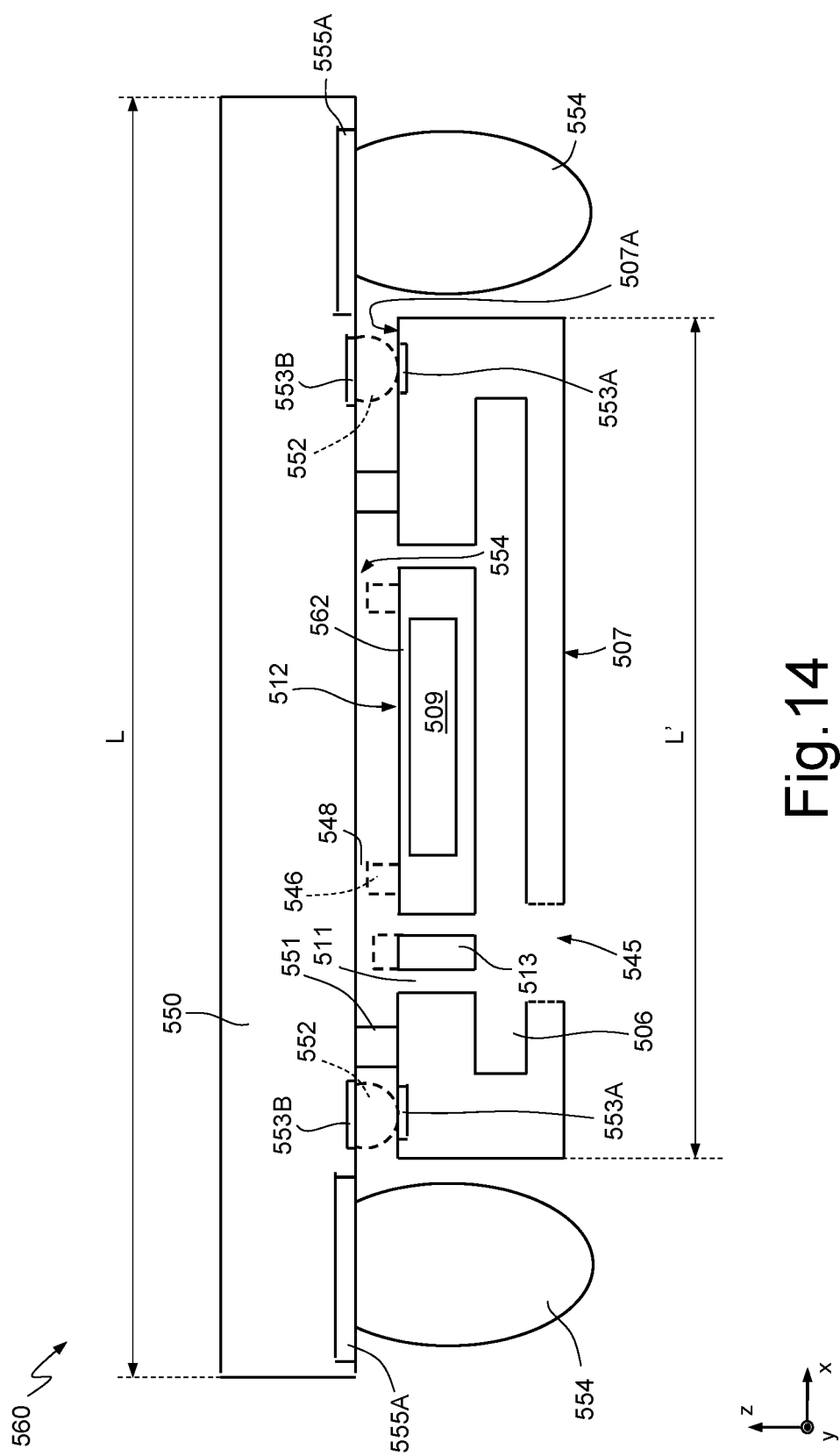
FIG. 14 shows a cross-section of a different embodiment of the present MEMS device.
Figure 15:
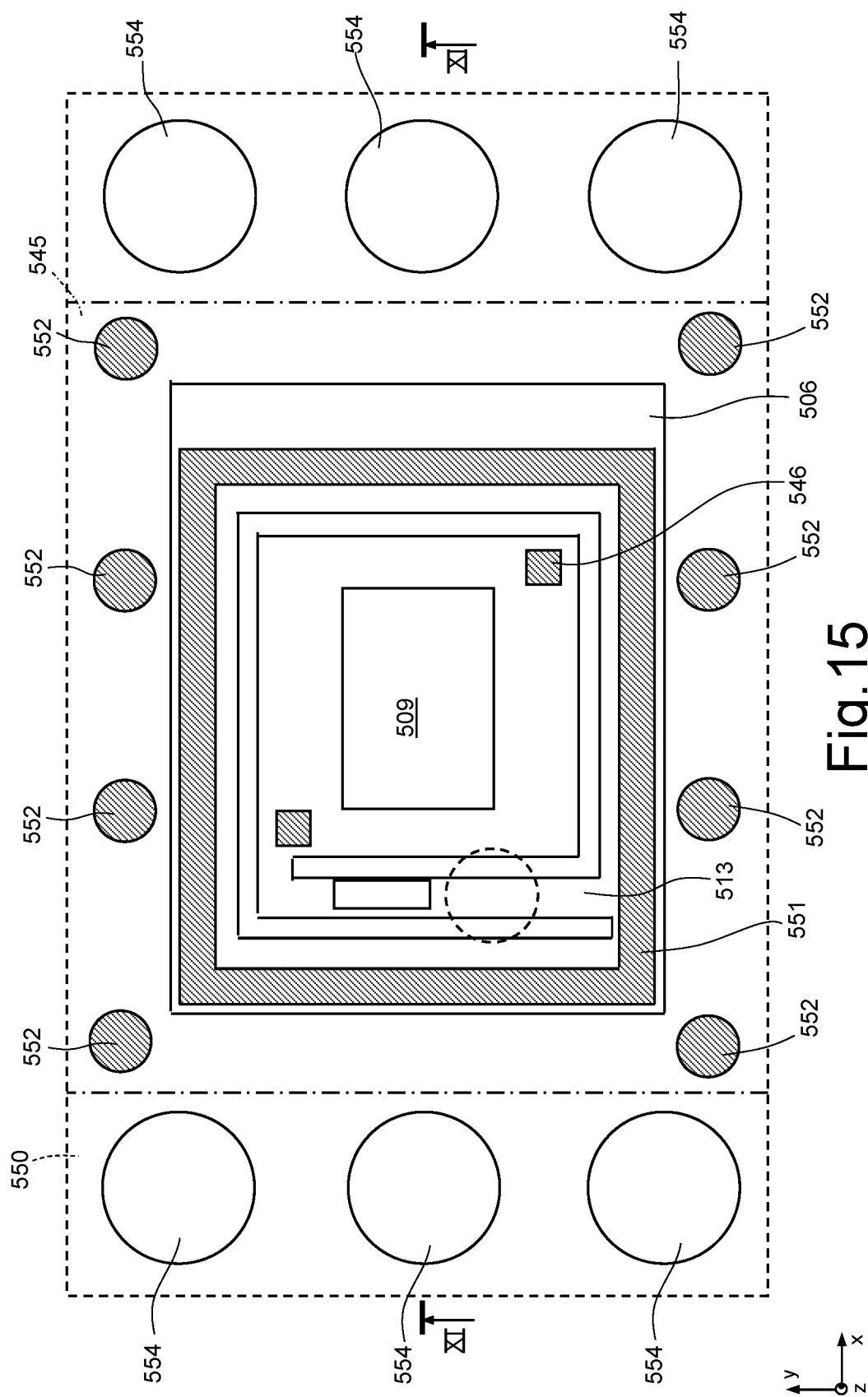
FIG. 15 shows a top view of the MEMS device of FIG. 14 with removed parts.

FIGS. 14 and 15 show a different embodiment of the present MEMS device; in particular, FIGS. 14 and 15 show a MEMS device 560 with a general structure similar to the one depicted in FIGS. 11 and 12. Thus, elements similar in structure and function to the ones shown and described in the device 260 of FIG. 11-12 will be referred to in FIGS. 14 and 15 with numbers increased by 300 and will not be described further.

In the present embodiment, the cap die 550 has an extension L along the first axis X which is greater than the extension L' of the sensor die 507.

In addition, as visible in FIG. 15, wherein the cap die 550 is removed and represented by a thin line, the spacer element 551 has a closed quadrangular shape; in such way, the spacer element 551 not only precisely sets the height of the gap 554, but also surrounds the sensitive portion 212, to avoid the penetration of residuals, such as solder, dust and the like.

In FIGS. 16A-16G different embodiments of the spacer elements 251, 551 and the stopper elements 246, 546 are shown. The manufacturing process is similar to the one depicted in FIGS. 13A-13F and the different embodiments described herein may be used in both devices 260 and 560 of FIGS. 11-12 and FIGS. 14-15, respectively. For a better understanding, the same reference numbers have been used hereinafter. It is also noted that FIGS. 16A-16G show only one stopper element 246, 546; it is obvious that the following teaching is applicable when other stopper elements 246, 546 are used in the MEMS device (as explained in FIGS. 11-12 and 14-15).

Figure 16A:
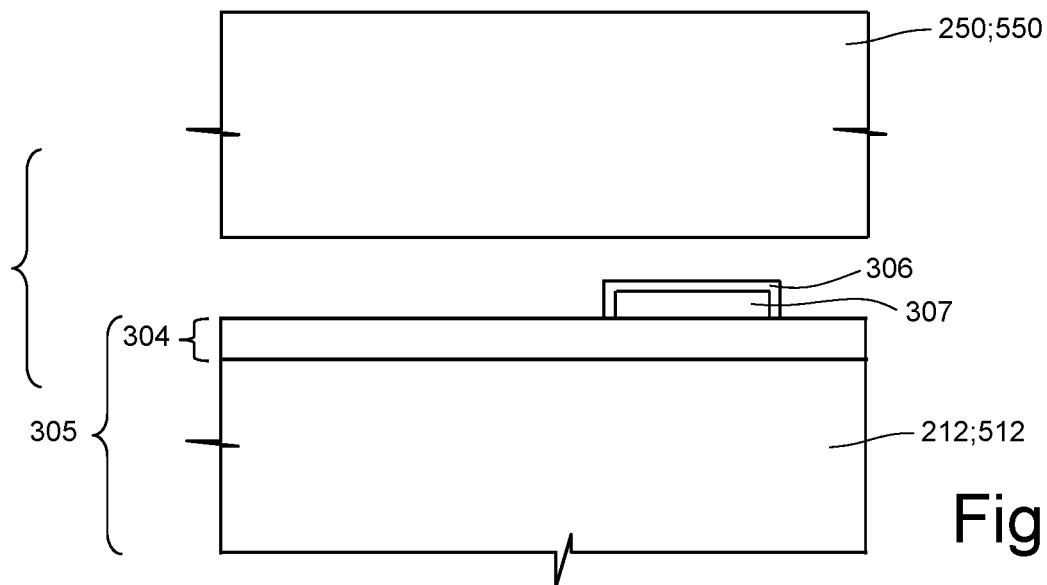
FIGS. 16A-16G show cross-sections of different embodiments of stoppers of the MEMS devices of FIGS. 11-14.

In particular, FIG. 16A, a single layer stopper 307 is grown on the previously formed stepped wafer 305 (see FIG. 13E); in detail, the single layer stopper 307 is formed on the fifth dielectric layer 288 of a second stack 304 including the first stack 280, the first and second step layers 282, 286 and the fourth and fifth dielectric layers 284, 288.

The single layer stopper 307 may be, for example, of metal or polysilicon; in particular, when of metal, for example grown through electroplating, the single layer stopper 307 may have a thickness, for example, of about 0.8 µm.

On the other hand, when the single layer stopper 307 is of polysilicon, it may have a thickness, for example, of 0.4 µm.

On the single layer stopper 307, a layer of oxide 306 is formed in a per se known manner and it has a thickness of, for example, 1 µm. The structure comprising the single layer stopper 307 and the layer of oxide 306 forms the stopper element 246, 546.

Figure 16B:
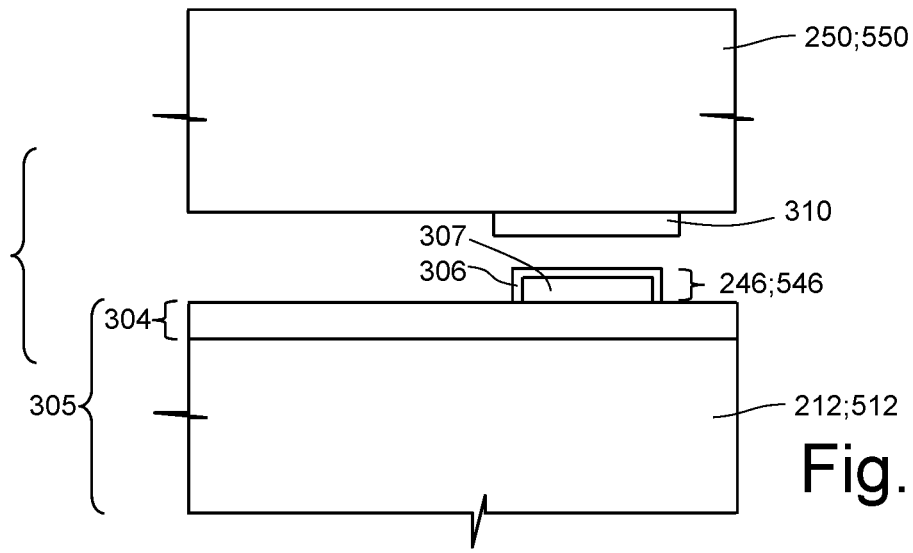

In FIG. 16B, the single layer stopper 307 is coupled with an electrode 310, which is deposited and defined in a per se known manner on the surface of the cap dice 250, 550 that faces the sensitive portion 212, 512. The single layer stopper 307 may be of the same material and dimensions indicated previously.

Since the electrode 310 is coupled with the single stopper layer 307, the MEMS device 260, 560 is able to perform capacitive measurements to self-check its correct operation without undue effort.

Figure 16C:
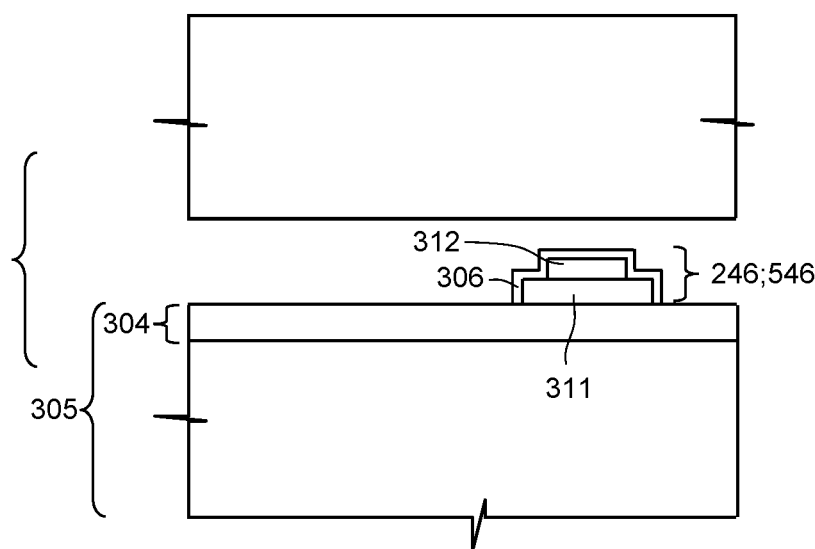

With reference to FIG. 16C, the stopper element 246, 546 is made by a double layer structure, comprising a first and a second stopper layer 311, 312, respectively. In particular, the first stopper layer 311 is deposited on the stack 304 and the second stopper layer 312 is deposited on the first stopper layer 311; moreover, the first and the second stopper layers 311, 312 may be formed in the same material or in different materials.

For example, the first stopper layer 311 may be of metal and the second stopper layer 312 may be of polysilicon or vice versa. Both the thicknesses and the deposition processes are the same as the ones described for FIGS. 16A-16B. In addition, the oxide layer 306 covers both the stopper layers 311, 312; in detail, the oxide layer 306 covers, at least in part, the second stopper layer 312 and the lateral portions of the first stopper layer 311. The oxide layer 306 and the first and the second stopper layers 311, 312 form the stopper element 246, 546.

Figure 16D:
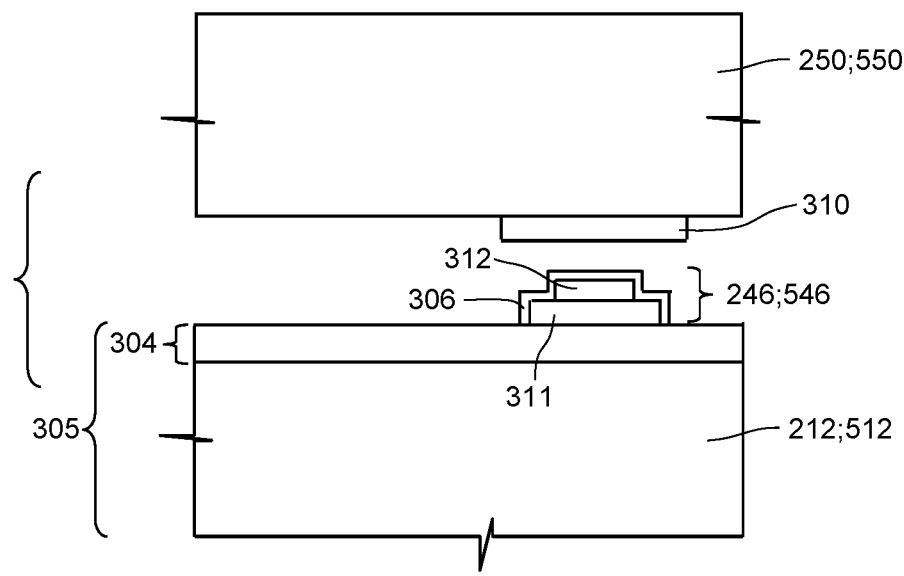

In FIG. 16D, in a similar manner to the single layer stopper 307 of FIG. 16B, the stopper element 246, 546 is capacitively coupled with the electrode 310 and thus allows the proper mode of operation of the device to be verified.

Figure 16E:
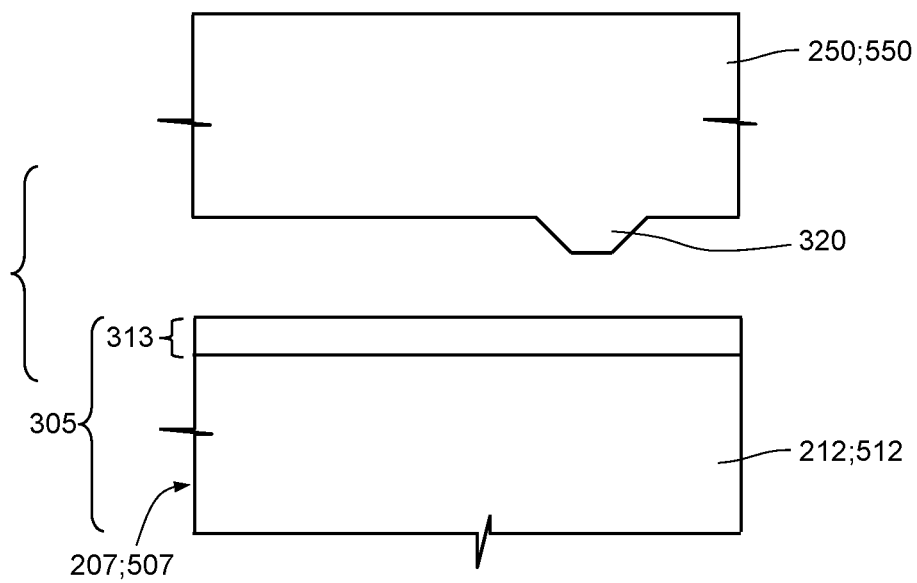

In FIG. 16E, a bumper 320 is formed in the cap die 250, 550 by known definition techniques; in particular, the bumper 320 is of the same material as the cap die 250, 550 (i.e., silicon, formed by selectively removing, such as by etching, neighboring portions of the wafer). In this case, an insulating layer or stack 313 (analogous to stack 304) extends on the surface of the sensitive portion 212, 512 and it is deposited in a per se known manner.

In this embodiment, the stopping function of the stopper element 246, 546 is performed by the bumper 320. Alternatively, the bumper 320 may be formed on the sensor die 207; 507.

Figure 16F:
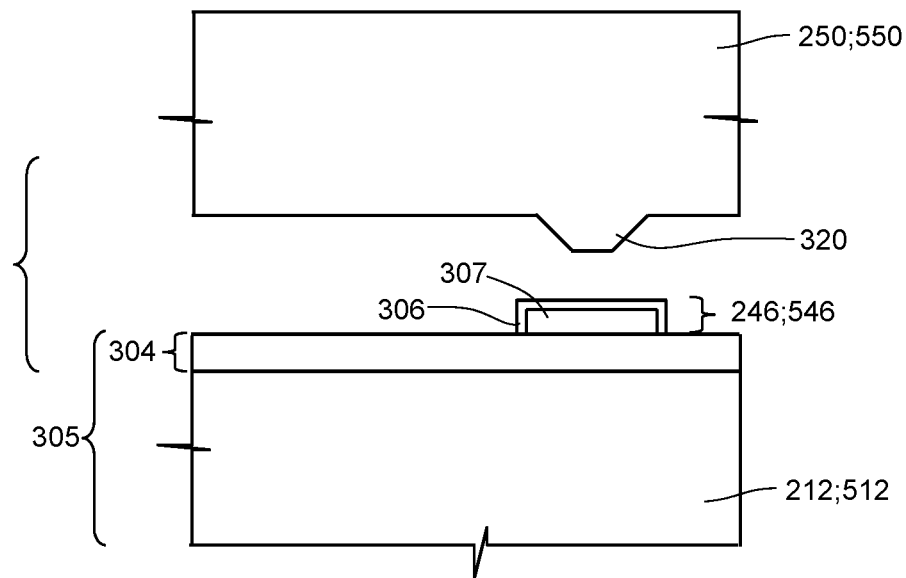

In another embodiment, FIG. 16F, the bumper 320 faces the single layer stopper 307, the latter being obtained in a similar way as described for FIG. 16A. In this embodiment, the stopping function is performed by both the bumper 320 and the single layer stopper 307.

Figure 16G:
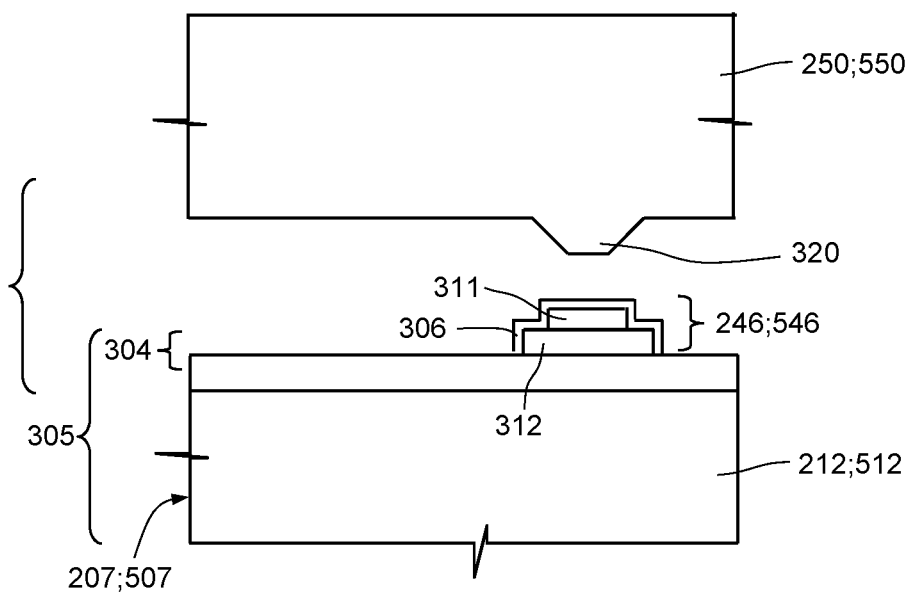

In FIG. 16G, the bumper 320 faces a double layer-stopper element 246, 546, and the latter may be formed in a similar way as described for FIG. 16C.

Also here, the double layer-stopper 246, 546 comprises first and the second stopper layers 311, 312 and oxide layer 306; moreover, the first and the second stopper layers 311, 312 may be of the same or different materials. In this embodiment, metal or polysilicon layers are considered.

In FIG. 16G, similarly to the embodiment of FIG. 16F, the stopping function is performed by both the bumper 320 and the double layer stopper 307.

The advantages of the embodiments described in FIGS. 11-12 and 14-15 are clear from the previously discussed disclosure.

In particular, the structure of the spacer elements 251, 551 allows to precisely set the gap between the soldered sensor die 207, 507 and cap die 250, 550; in fact, during the soldering process, the height of the gap 254, 554 is not modified.

Moreover, the stopping elements, such as stopper elements 246, 546 and bumper 320, allow the sensitive portion 212, 512 of the MEMS device 260, 560 to be protected against mechanical shocks, thus increasing the robustness of the device itself. In fact, the internal gap 248, 548, due to the difference in height between the stopper element 246, 546 and the spacer element 251, 551, represents a safe margin to preserve the integrity of the sensitive portion 212, 512.

As previously discussed in FIGS. 16B and 16D, by coupling the stopper element 246, 546 with an electrode 310, it is possible to perform capacitive measurements on a wafer and/or on a device levels, in order to verify the integrity and the proper mode of operation of the MEMS device 260, 560.

The MEMS device 260, 560 may be provided in place of or in addition to the MEMS device in the electronic apparatus 170 of FIG. 10.

Finally, it is clear that modifications and variations may be made to the device and the manufacturing process described and illustrated herein, without thereby departing from the scope of the present disclosure. For example, the described embodiments may be combined for providing further solutions. In particular, the MEMS device 120 may be a sensor or an actuator of a different type, which may be obtained using MEMS technology and specify a mechanical decoupling from the rest of the chip.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A micro-electro-mechanical device, comprising:
   a monolithic body of semiconductor material having a first face, a second face and a first length in a first direction;
   a first buried cavity in the monolithic body of semiconductor material;
   a sensitive region in the monolithic body facing the first buried cavity;
   a movable element over a second cavity that faces the first buried cavity;
   an open decoupling trench extending from the first face of the monolithic body as far as the first buried cavity, the open decoupling trench and the first buried cavity being in fluid communication with each other, the open decoupling trench separating the sensitive region from a peripheral portion of the monolithic body;
   a cap die, having a first face and a second length in the first direction, the cap die being bonded to and facing the first face of the monolithic body such that a first gap is between the first face of the cap die and the first face of the monolithic body, wherein the first length is greater than the second length;

at least one spacer element between the first faces of the monolithic body and the cap die;

at least one stopper element on the first face of one of the monolithic body or the cap die; and a second gap between the at least one stopper element and the first face of one of the monolithic body or the cap die, the second gap being smaller than the first gap.

2. The device of claim 1, wherein the at least one spacer element and the at least one stopper element are of a material selected from metal or polysilicon.

3. The device of claim 1, wherein the at least one stopper element is a single layer structure.

4. The device of claim 1, wherein the at least one stopper element comprises a first stopper layer and a second stopper layer.

5. The device of claim 4, wherein the first stopper layer and the second stopper layer are of the same material.

6. The device of claim 4, wherein the first stopper layer and the second stopper layer are of different materials.

7. The device of claim 1, wherein the first length is less than the second length.

8. The device of claim 1, wherein the cap die is an application specific integrated circuit (ASIC).

9. The device of claim 1, wherein the cap die comprises a substrate of semiconductor material.

10. A micro-electro-mechanical device comprising:
a monolithic body of semiconductor material having a first face, a second face and a first length in a first direction;
a first buried cavity in the monolithic body of semiconductor material;
a sensitive region in the monolithic body facing the first buried cavity;
a movable element over a second cavity that faces the first buried cavity;
an open decoupling trench extending from the first face of the monolithic body as far as the first buried cavity, the open decoupling trench and the first buried cavity being in fluid communication with each other, the open decoupling trench separating the sensitive region from a peripheral portion of the monolithic body;
a cap die, having a first face and a second length in the first direction, the cap die being bonded to and facing the first face of the monolithic body such that a first gap is between the first face of the cap die and the first face of the monolithic body;
at least one spacer element between the first faces of the monolithic body and the cap die;
at least one stopper element on the first face of one of the monolithic body or the cap die;
a second gap between the at least one stopper element and the first face of one of the monolithic body or the cap die, the second gap being smaller than the first gap; and
at least one electrode extending on the first surface of the one of the monolithic body or the cap die, the electrode facing and being capacitively coupled to the at least one stopper element.

11. The micro-electro-mechanical device of claim 10, wherein the at least one stopper element is on the first surface of the monolithic body and the second gap is between the at least one stopper element and the cap die.

12. The micro-electro-mechanical device of claim 10, wherein the at least one stopper element is on the cap die and the second gap is between the at least one stopper element and the first surface of the monolithic body.

13. The micro-electro-mechanical device of claim 10, wherein the cap die is a semiconductor die that includes an application specific integrated circuit (ASIC).

* * * * *